US011442024B2

(12) United States Patent
Kondo et al.

(10) Patent No.: US 11,442,024 B2
(45) Date of Patent: Sep. 13, 2022

(54) DEFECT CLASSIFICATION DEVICE, INSPECTION DEVICE, AND INSPECTION SYSTEM

(71) Applicant: Hitachi High-Technologies Corporation, Tokyo (JP)

(72) Inventors: Takanori Kondo, Tokyo (JP); Toshifumi Honda, Tokyo (JP); Akira Hamamatsu, Tokyo (JP); Hideo Ota, Tokyo (JP); Yoshio Kimoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 351 days.

(21) Appl. No.: 16/642,948

(22) PCT Filed: Sep. 11, 2017

(86) PCT No.: PCT/JP2017/032731
§ 371 (c)(1),
(2) Date: Feb. 28, 2020

(87) PCT Pub. No.: WO2019/049387
PCT Pub. Date: Mar. 14, 2019

(65) Prior Publication Data
US 2020/0256807 A1    Aug. 13, 2020

(51) Int. Cl.
*G01N 21/95* (2006.01)
*G01N 21/956* (2006.01)

(52) U.S. Cl.
CPC ....... *G01N 21/9501* (2013.01); *G01N 21/956* (2013.01)

(58) Field of Classification Search
CPC ............ G01N 21/9501; G01N 21/956; G01N 21/8851; G01N 2021/8438;
(Continued)

(56) References Cited

U.S. PATENT DOCUMENTS 8,319,960 B2 *  11/2012  Aiko ................. H04N 7/18
                                                356/237.5
8,908,172 B2 *  12/2014  Urano ............... G01N 21/9501
                                                356/237.5
(Continued)

FOREIGN PATENT DOCUMENTS

JP    2011-13077 A     1/2011
JP    2014-48206 A     3/2014
JP    2016-212009 A    12/2016

OTHER PUBLICATIONS

International Search Report (PCT/ISA/210) issued in PCT Application No. PCT/JP2017/032731 dated Oct. 24, 2017 with English translation (seven (7) pages).
(Continued)

*Primary Examiner* — Hung V Nguyen
(74) *Attorney, Agent, or Firm* — Crowell & Moring LLP

(57) ABSTRACT

In order to prevent an erroneous determination of an on-film defect, the sensitivity of the post-inspection is reduced so that a film swelling due to a minute defect would not be detected. Classification is performed to determine whether a defect is at least one of an on-film defect and a film swelling, by performing a coordinate correction on the result of a post-inspection by an actual-defect fine alignment using the result of a pre-inspection performed with two-stage thresholds, and by checking defects against each other. In addition, classification is performed to determine whether a defect is at least one of an on-film defect and a film swelling by, during the post-inspection, preparing instruction data from information of the refractive index and thickness of a film formed on a wafer and comparing the instruction data with a signal intensity ratio of a detection system.

11 Claims, 15 Drawing Sheets

(58) Field of Classification Search
CPC ...... G01N 21/95607; G01N 2021/8867; H01L 22/12; H01L 22/20
See application file for complete search history.

(56) References Cited

U.S. PATENT DOCUMENTS

| | | | |
|---|---|---|---|
| 9,208,553 B2 * | 12/2015 | Cao | ........................ G06T 7/0004 |
| 2006/0068512 A1 | 3/2006 | Ohshima et al. | |
| 2012/0092484 A1 | 4/2012 | Taniguchi et al. | |

OTHER PUBLICATIONS

Japanese-language Written Opinion (PCT/ISA/237) issued in PCT Application No. PCT/JP2017/032731 dated Oct. 24, 2017 (four (4) pages).

* cited by examiner

FIG. 2A
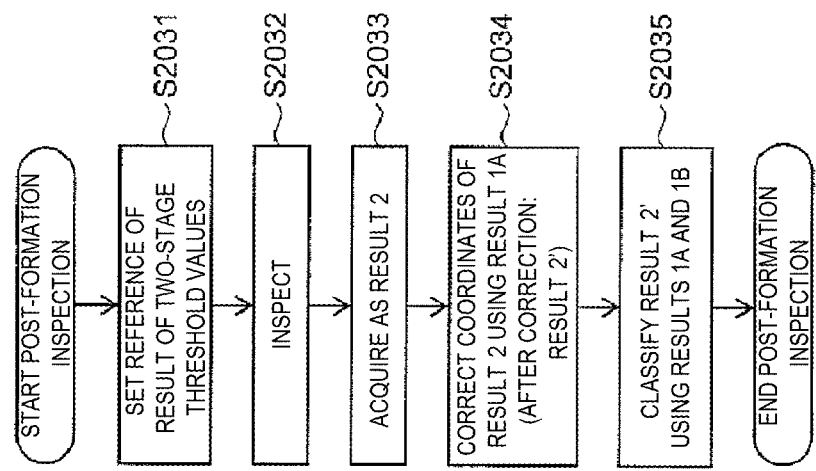
FIG. 2B
FIG. 2C
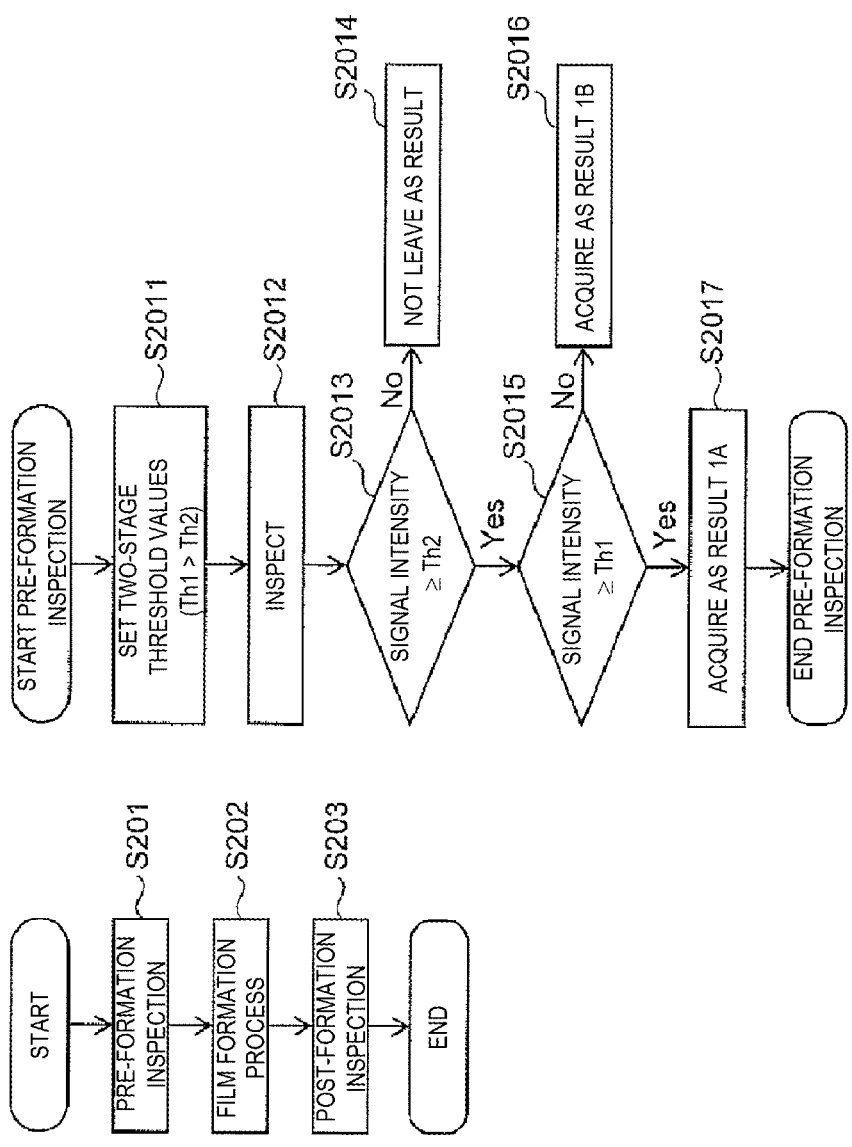

[FIG. 5]
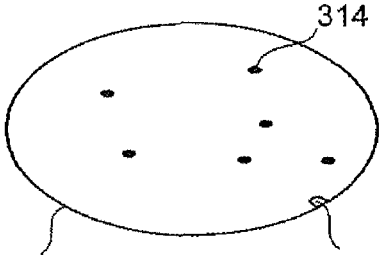

[FIG. 6]
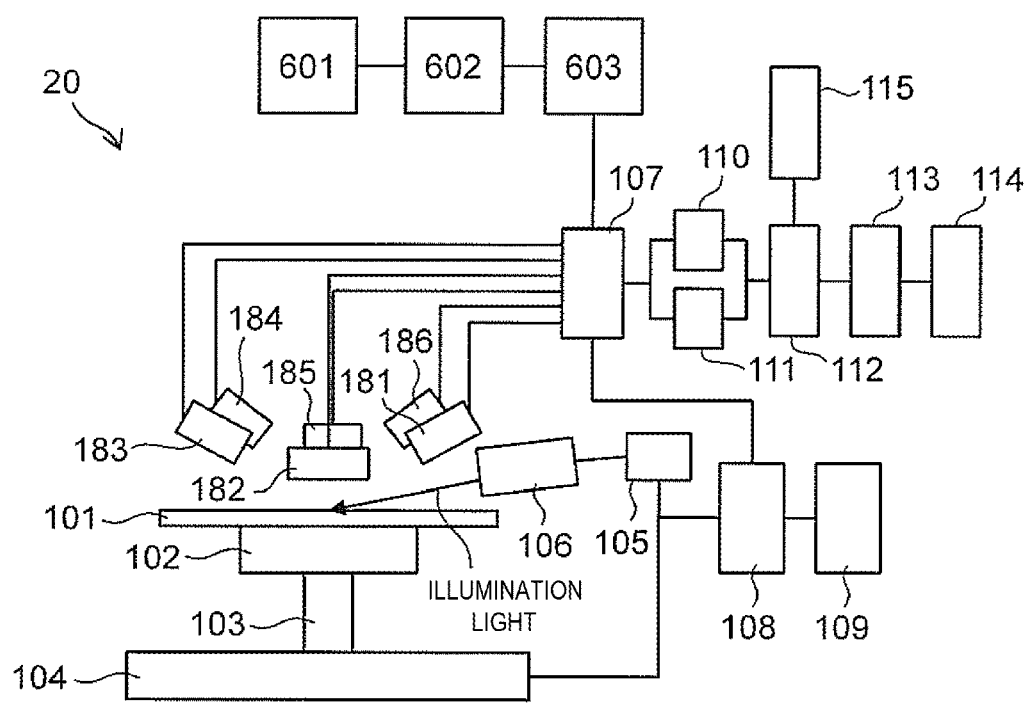

[FIG. 8]

[FIG. 9]
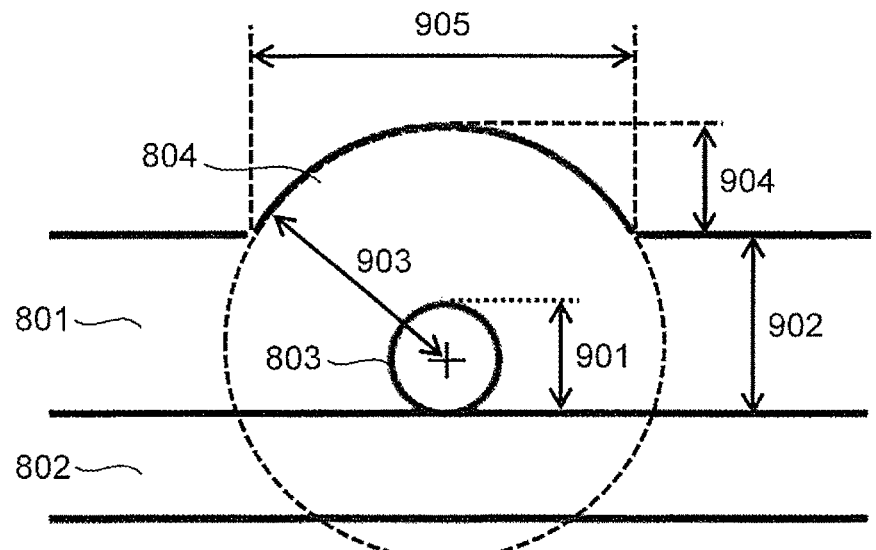
[FIG. 10]
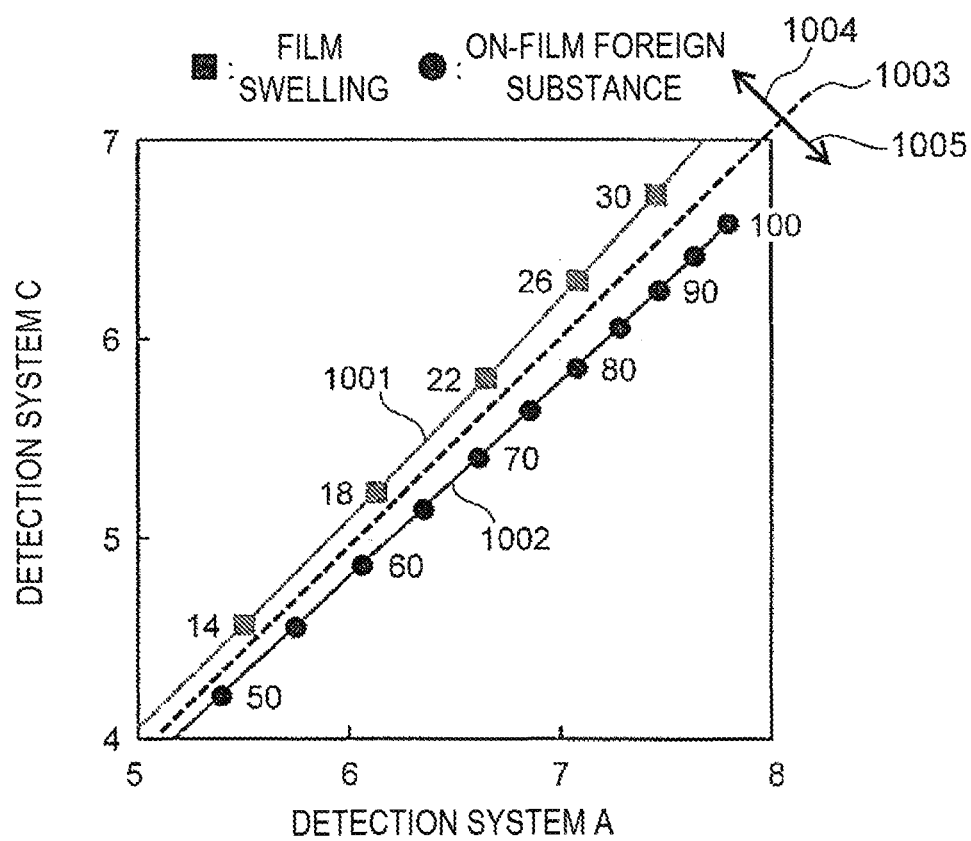

[FIG. 11]
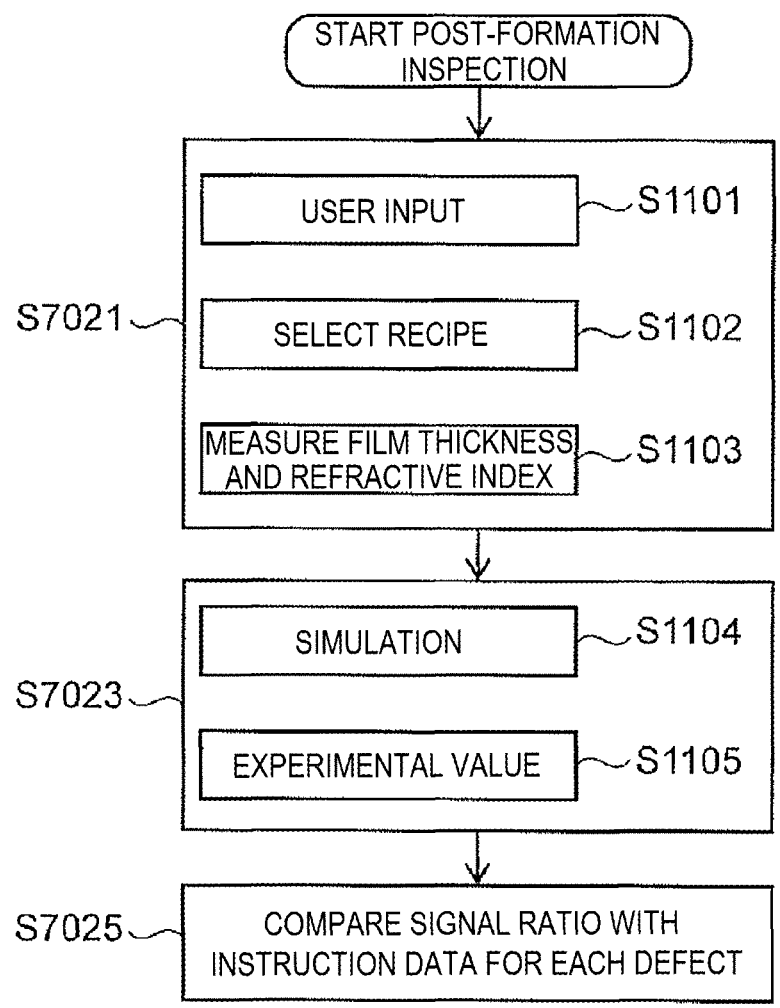

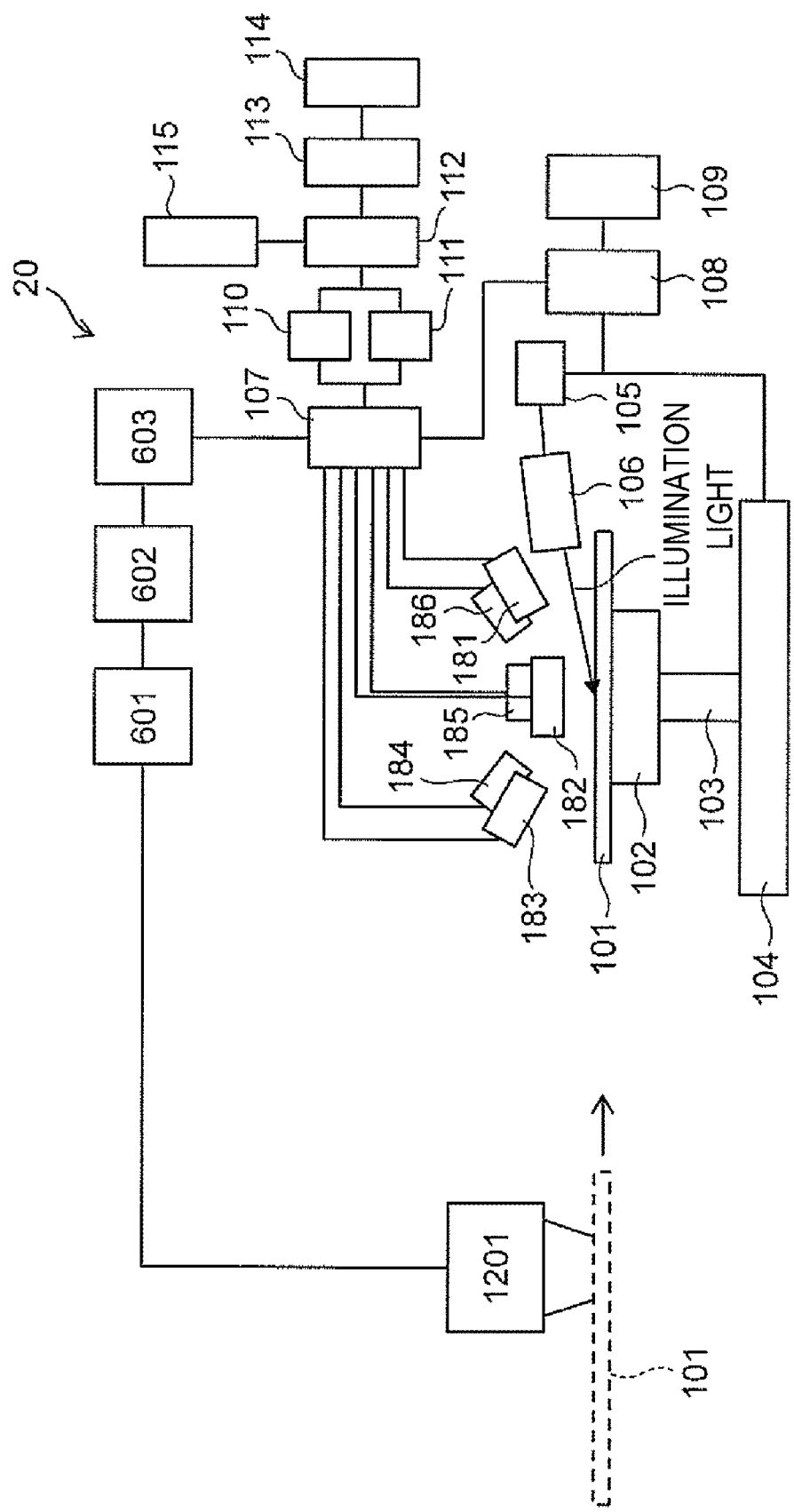
[FIG. 12]

[FIG. 13]
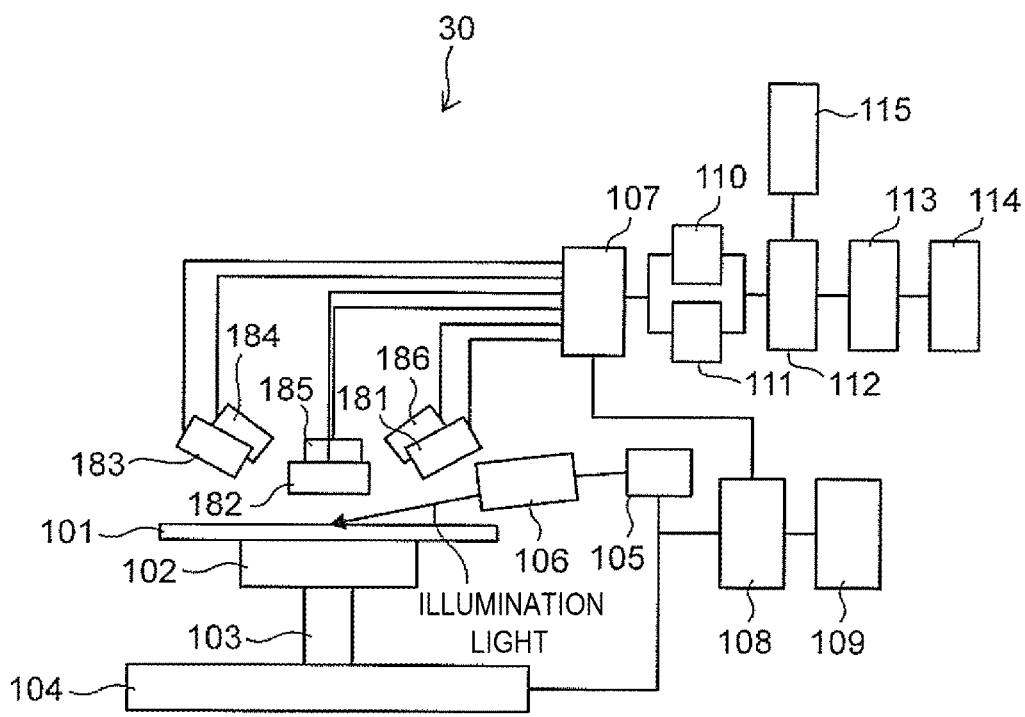

DEFECT CLASSIFICATION DEVICE, INSPECTION DEVICE, AND INSPECTION SYSTEM

TECHNICAL FIELD

The present invention relates to a defect classification device, an inspection device, and an inspection system.

BACKGROUND ART

In a semiconductor device manufacturing process, particularly a film formation process, in order to perform process monitoring, it is important to inspect a wafer surface before and after a film formation process and manage dust generation in the process. This management requires accurate classification of defects before film formation and defects after the film formation.

CITATION LIST

Patent Literature

PTL 1: US2006-0068512A1

SUMMARY OF INVENTION

Technical Problem

In the film formation process, a minute defect that an inspection before film formation (pre-formation inspection) has failed to detect becomes a larger film swelling due to film formation. Since the film swelling often cannot be distinguished from an on-film defect, the film swelling may be detected during an inspection after the film formation (post-formation inspection) as being a defect that is generated on the film (hereinafter referred to as an on-film defect). In order to prevent an erroneous determination of the on-film defect, for example, in the technique disclosed in PTL 1, a sensitivity of the post-formation inspection has been reduced so that the film swelling due to the minute defect would not be detected.

However, when the technique disclosed in PTL 1 is used, the erroneous determination of the on-film defect can be avoided, but there remains a problem that the on-film defect and the film swelling cannot be clearly distinguished.

The present disclosure has been made in view of such a situation, and an object thereof is to provide a technique for clearly and efficiently distinguishing an on-film defect and a film swelling.

Solution to Problem (1) To solve the above problems, a defect classification device according to the present disclosure includes a storage device; and a signal processing device configured to acquire a first detection signal obtained by irradiating a wafer before a film formation process with a light and a second detection signal obtained by irradiating the wafer after the film formation process with a light, classify a defect on the wafer using signal intensities of the first and second detection signals, and store a classification result in the storage device, in which the signal processing device is configured to compare a first threshold value with a signal intensity of the first detection signal, and compare a second threshold value having a value smaller than the first threshold value with the signal intensity of the first detection signal, an inspection signal of the first threshold value or more being taken as a first result, and an inspection signal of the second threshold value or more and less than the first threshold value being taken as a second result; and classify the defect on the wafer by comparing the first result with the second detection signal, and the second result with the second detection signal.

(2) A defect classification device according to another aspect of the present disclosure includes a storage device; and a signal processing device configured to acquire detection signals detected by a plurality of detection systems obtained by irradiating a wafer after a film formation process with a light, classify a defect on the wafer using signal intensities of the detection signals, and store a classification result in the storage device, in which the signal processing device is configured to read out, from the storage device, instruction data for determining whether a signal obtained from a result of an inspection is a signal due to a defect, the instruction data being corresponding to film information of the wafer, compare the instruction data with a signal intensity ratio of the detection signals from at least two detection systems, and classify the defect on the wafer based on a result of the comparing.

Further features relevant to the present disclosure will become apparent from a description of the description and the accompanying drawings. Aspects of the present disclosure may be achieved and implemented by means of the elements and combinations of various elements and the following detailed description and accompanying claims.

It should be understood that the description herein is exemplary only and is not intended to limit a scope or an application of the disclosure in any way.

Advantageous Effect

According to the present disclosure, it is possible to clearly distinguish between an on-film defect and a film swelling for defects on a wafer surface, and to classify the defects efficiently.

BRIEF DESCRIPTION OF DRAWINGS

FIGS. 2A to 2C are flowcharts showing a classification process of an on-film defect and a film swelling by checking a result of a pre-formation inspection against a result of a post-formation inspection.

FIG. 5 is a diagram showing an inspection result obtained by the two-stage threshold values for each detection signal.

FIG. 6 is a diagram showing a schematic configuration of an inspection device 30 according to a third embodiment.

FIG. 7 is a flowchart

FIG. 8 is a diagram showing a scattered light distribution and a detection signal ratio for the film swelling and for the on-film defect.

FIG. 9 is a diagram showing a relationship between the film swelling and a sub-film defect that is a core of the swelling.

FIG. 10 is a diagram showing classification of the film swelling and the on-film defect based on the detection signal ratio.

FIG. 11 is a diagram showing a method of acquiring film information and a method of preparing instruction data.

FIG. 12 is a diagram showing a method of measuring the film information.

FIG. 13 is a diagram showing a pre-formation inspection in which the two-stage threshold values are not set.

DESCRIPTION OF EMBODIMENTS

The present embodiment relates to a wafer surface inspection device, for example, a defect inspection using a light scattering method, and particularly to a wafer surface defect inspection device for performing process monitoring in a semiconductor device manufacturing process.

Embodiments of the present disclosure will be described below with reference to the accompanying drawings. In the accompanying drawings, functionally the same element may be displayed with the same number. The accompanying drawings show specific embodiments and implementation examples consistent with principles of the present disclosure, and are for the understanding of the present disclosure and are not intended to be construed in a limiting sense.

It is necessary to understand that the present embodiment is described in sufficient detail for those skilled in the art to perform the present disclosure, but other implementations and aspects are possible, and the configuration and the structure can be changed and various elements can be replaced without departing from the scope and the spirit of the technical idea of the present disclosure. Therefore, the following description should not be construed as being limited to the present embodiment.

(1) First Embodiment

In the first embodiment, a classification of an on-film defect and a film swelling by checking between a pre-formation inspection and a post-formation inspection (a comparison of inspection results) will be described.
<Schematic Configuration of Inspection Device>
FIG. 1 is a diagram showing a schematic configuration of an inspection device 10, a configuration and an arrangement of a detection system, and a beam spot scanning method according to a first embodiment of the present disclosure.

Figure 1A:
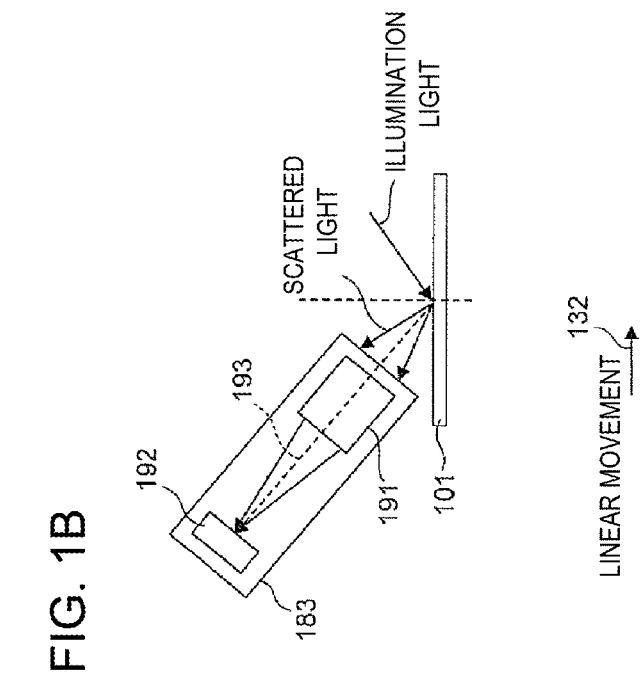
FIGS. 1A to 1D are diagrams showing a schematic configuration of an inspection device 10, a configuration and an arrangement of a detection system, and a beam spot scanning method according to a first embodiment of the present disclosure.
Figure 1B:
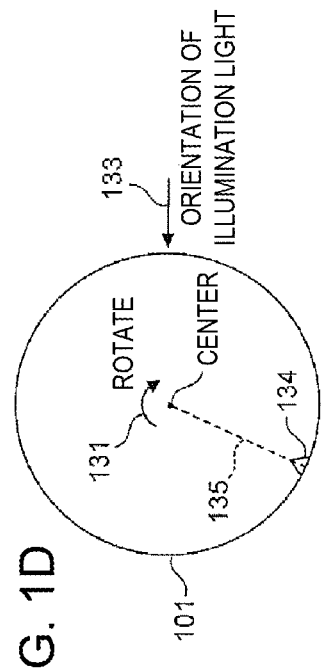
Figure 1C:
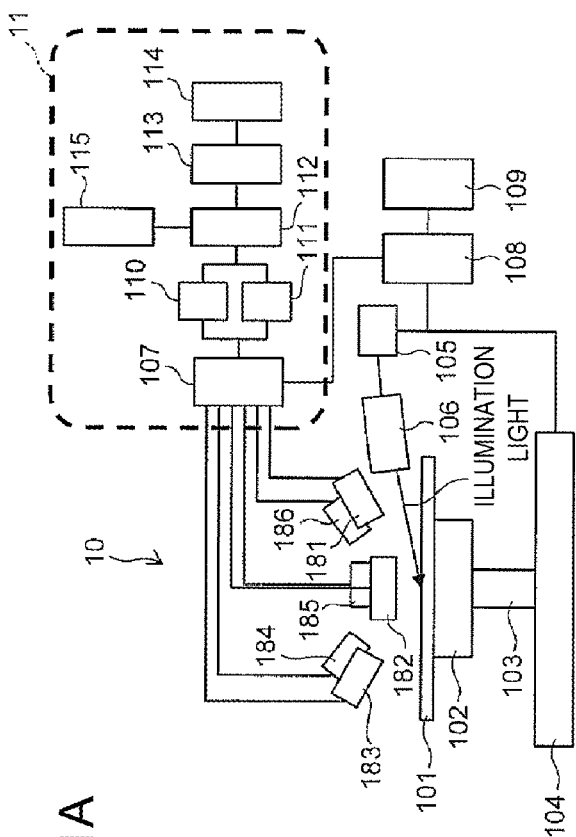
Figure 1D:
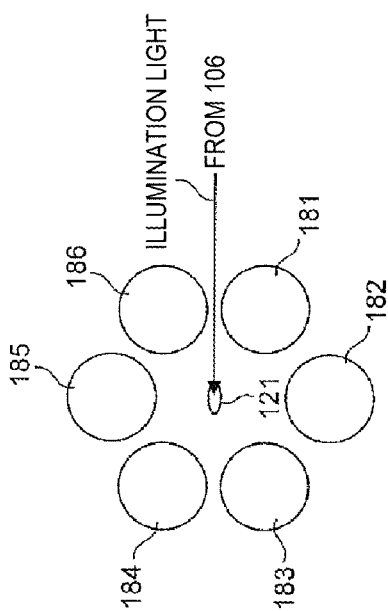

FIG. 1A is a diagram showing a schematic configuration of the inspection device 10. FIG. 1B is a diagram showing an arrangement of a detection system that detects a scattered light from a wafer. FIG. 1C is a diagram showing a configuration example of one detection system. FIG. 1D is a diagram showing a beam spot scanning method.
(i) Configuration of Inspection Device Referring to FIG. 1A, the inspection device 10 according to the present embodiment includes, for example, a chuck 102 to which a wafer 101 is adsorbed, a rotary stage 103 equipped with the chuck 102, a straight movement stage 104 on which the rotary stage 103 is mounted, a light source 105, an illumination optical system 106 having a lens, a mirror and the like, detection systems 181 to 186 having lenses, mirrors and the like, a signal processing system 11, a control unit 108, and an operation system 109.

As will be described later with reference to FIGS. 2 and 3, the signal processing system 11 is configured so that two-stage threshold values can be set. The signal processing system 11 includes an observation signal processing system 107, a classification signal processing system 1_110 configured to process an inspection result with a high threshold value Th1, a classification signal processing system 2_111 configured to process an inspection result with a low threshold value; a recording device 112 that records the processing results of the classification signal processing system 1_110 and the classification signal processing system 2_111; a calculation device (coordinate calculation device) 113 configured to check the results of the classification signal processing system 1_110 and the classification signal processing system 2_111 against coordinates; a calculation device (alignment calculation device) 114 configured to perform an actual defect alignment using the checking result; and an input unit 115 configured to input a wafer identification ID and a process state (for example, including a pre-formation inspection process, a post-formation inspection process, and a film formation process). Information input to the input unit 115 may be input to the operation system 109 by an operator along with a recipe condition. The wafer identification ID and the process state are expressed on an inspection result screen or recipe information. The process state can be included in the wafer identification ID. In this case, a table for converting the wafer identification ID into an individual and the process state is necessary.
(ii) Configuration of Detection System The arrangement of the detection systems 181 to 186 will be described with reference to FIG. 1B. By converging illumination light emitted from the illumination optical system 106, a beam spot 121 is formed on a surface of the wafer 101. A scattered light generated from the beam spot 121 is detected by a plurality of the detection systems 181 to 186. The detection systems 181 to 186 are arranged with different azimuth angles at the same elevation angle.

The illumination light is supplied obliquely to the wafer 101 and the detection systems 181 to 186 detect scattered light, so that the inspection device 10 of the present embodiment can be expressed as a so-called dark field device. A shape of openings of the detection systems 181 to 186 is shown to be a substantial circle when the wafer 101 is viewed from a normal line direction as shown in FIG. 1B, but the same method can be used for a polygonal shape.
(iii) Configuration Example of Detection System FIG. 1C is a diagram showing a configuration example of one detection system (for example, the detection system 181). Other detection systems are similar, and a description thereof is omitted.

The detection system 181 includes a detection optical system 191 having an optical axis 193, and a photoelectric conversion element 192. The beam spot 121 is formed on the wafer 101 by the illumination light emitted onto the wafer 101, and light is scattered from the beam spot 121 at each elevation angle and azimuth angle. The scattered light is focused by the detection optical system 191 having a certain numerical aperture. The detection optical system 191 includes a plurality of lenses (lens group), and constitutes a so-called focusing optical system or an imaging optical system. The focused scattered light is subjected to photoelectric conversion by the photoelectric conversion element 192 after an unwanted light is blocked by a spatial filter or a polarizing filter. Since a signal subjected to the photoelectric conversion is obtained as a current or a voltage, the signal is AD-converted and processed by the observation signal processing system 107. Examples of the photoelectric conversion element 192 include a photomultiplier tube, an avalanche photodiode array, and a multi-pixel photon counter.

(iv) Beam Spot Scanning Method

FIG. 1D is a diagram showing a scanning method of the beam spot 121. The wafer 101 rotates in a direction indicated by an arrow 131 by the rotary stage 103 while moving straight in a direction indicated by an arrow 132 by the straight movement stage 104. Due to the straight movement operation and the rotation operation, an entire surface of the wafer 101 is scanned with the beam spot 121, and a trajectory of the beam spot 121 becomes concentric or spiral. Coordinates of the beam spot 121 can be managed by a distance from a center and a rotation angle (so-called polar coordinate system). The rotation angle can be expressed with reference to a virtual reference line 135 (for example, a half-line passing through a notch 134 and the center of the wafer) on the wafer.

<Classification Processing of On-Film Defect and Film Swelling>

FIG. 2 is a flowchart showing a classification process of the on-film defect and the film swelling by checking a result of the pre-formation inspection against a result of the post-formation inspection. FIG. 2A is a diagram showing an entire process of the inspection. FIG. 2B is a flowchart showing details of the pre-formation inspection. FIG. 2B is a flowchart showing details of the post-formation inspection.

(i) Entire Process of Inspection (i-1) Step 201

The inspection device 10 is used to perform the pre-formation inspection on the wafer before the film formation process.

(i-2) Step 202

The film formation process is performed on the wafer 101 after the pre-formation inspection. In this process, a physical vapor phase method such as vapor deposition or sputtering, a chemical vapor phase method using heat or plasma, a thermal oxidation method of forming an oxide film, plating, coating, sol-gel, spin coating, or the like is performed.

(i-3) Step 203

Finally, the inspection device 10 is used to perform the post-formation inspection on the wafer 101 after the film formation process. Based on information of the wafer identification ID and the process state input to the input unit 115 in the inspection device 10, an identification of the pre-formation inspection and the post-formation inspection, or a selection of the result of the pre-formation inspection to be checked against the post-formation inspection is performed.

(ii) Content of Pre-Formation Inspection (ii-1) Step 2011

The observation signal processing system 107 sets two-stage threshold values Th1 and Th2 (where Th1>Th2) when the pre-formation inspection is started. Th1 is set in the classification signal processing system 1_110, and Th2 is set in the classification signal processing system 2_111 in FIG. 1A. Th1 is a high threshold value at which a commonly used noise signal is not detected, and for example, a value with a detection reproducibility of 90% or more is used. Th2 is a threshold value at which the noise is moderately detected. In addition to manually setting Th1 and Th2, there is a method of automatically calculating and setting Th1 and Th2 based on a noise level. The manual setting or the automatic setting can be selected by the operator using the operation system 109 according to an instruction. In the case of the manual setting, the control unit 108 sets the threshold values Th1 and Th2 input from the operation system 109 to each classification signal processing system via the observation signal processing system 107. In the case of automatically calculating the threshold values Th1 and Th2 based on the noise signal, the observation signal processing system 107 can respond to an instruction signal indicating that the threshold value is automatically set from the control unit 108, for example, acquire a common noise signal value of signals obtained by irradiating the wafer with light (for example, by inputting from outside or reading from a memory not shown), calculate an average value and a variance value of the signals, and derive the threshold values Th1 and Th2 based on the average value and the variance value.

(ii-2) Step 2012

After setting the two-stage threshold values, the observation signal processing system 107 acquires a signal of the scattered light obtained by irradiating the wafer 101 with illumination light.

(ii-3) Step 2013

The observation signal processing system 107 compares a signal intensity with Th2 during an inspection. The observation signal processing system 107 does not leave a signal less than Th2 (in the case of No in step 2013) as a detection result (step 2014).

(ii-4) Step 2015

The observation signal processing system 107 compares Th1 with a signal equal to or larger than Th2 (in the case of Yes in step 2013). The observation signal processing system 107 acquires a signal equal to or larger than Th2 and less than Th1 (in the case of No in step 2015) as a result 1B (step 2016).

(ii-5) Step 2017

The observation signal processing system 107 acquires a signal equal to or larger than Th1 as a result 1A.

In a common inspection in which the two-stage threshold values are not set, only the result 1A is acquired. These results are stored in the recording device 112 in the inspection device 10.

(iii) Supplementary Description for Pre-Formation Inspection

Figure 3A:
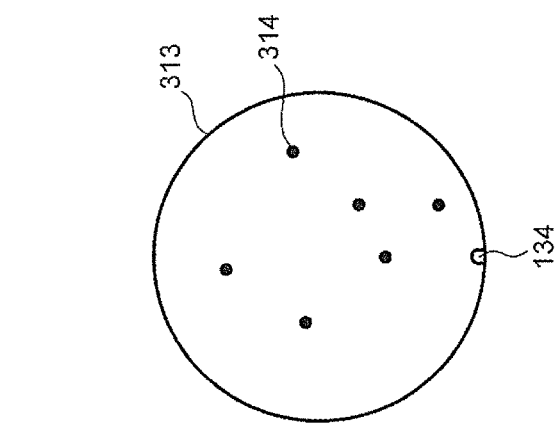
FIGS. 3A to 3D are diagrams showing a detection signal and two-stage threshold values in the pre-formation inspection.
Figure 3B:
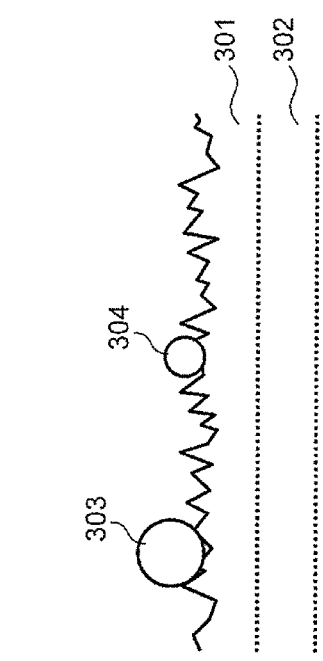
Figure 3C:
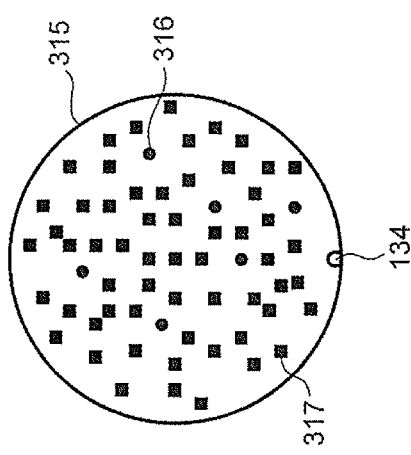
Figure 3D:
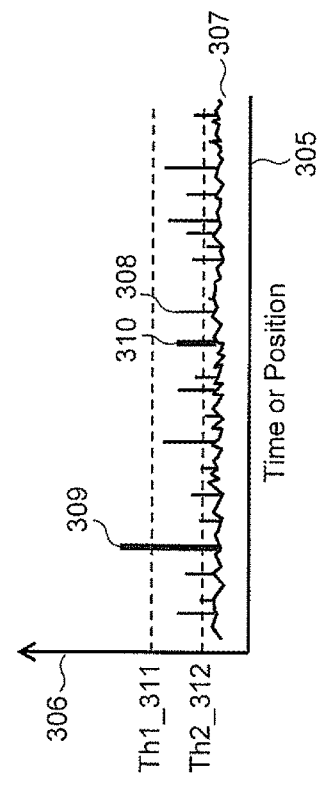

The pre-formation inspection (FIG. 2B) will be supplementarily described with reference to FIG. 3. Among the defects, a particle is taken as an example. FIG. 3A is a diagram showing a cross section of a wafer surface to be subjected to the pre-formation inspection. FIG. 3B is a diagram showing a detection signal when FIG. 3A is inspected. FIG. 3C is a diagram showing an inspection result (example) corresponding to the result 1A of FIG. 2B detected with a threshold value Th1_311. FIG. 3D is a diagram showing an inspection result (example) corresponding to a result obtained by adding the result 1A and the result 1B of FIG. 2B (a result 1A+1B) detected with a threshold value Th2_312.

In FIG. 3A, a layer 301 is an outermost layer of the wafer before the film formation. The layer 302 is a layer formed in a previous process before the layer 301, and may be a silicon wafer itself. Here, it is assumed that a large particle 303 and a small particle 304 are on a surface of the layer 301.

In FIG. 3B, a horizontal axis 305 indicates time or a coordinate on the wafer. A vertical axis 306 indicates the signal intensity. A stationary signal 307 is output by a background light scattered from the wafer surface. In addition to this stationary output, a random noise signal 308 is generated. When a signal by the large particle 303 is referred to as a detection signal 309 and a signal by the small particle 304 is referred to as a signal 310, the detection signal 309 is a signal sufficiently larger than the noise signal, whereas the detection signal 310 is a signal equivalent to the noise signal. When the inspection threshold value Th1_311 is used, only the detection signal 309 is detected. On the other hand, when the inspection threshold value Th2_312 is used, a plurality of noise signals is detected in addition to the signal 309.

As shown in FIG. 3C, an inspection result 313 includes information of at least an intensity of the detection signal and a coordinate (in a plane coordinate system or a polar coordinate system) based on, for example, the notch 134. A signal such as the signal 309 is shown as a black dot 314 (•). In FIG. 3D, an inspection result 315 includes black square dots 317 (■) that are the small particle signal 310 and the noise signal 308 in addition to a black dot 316 (•) that is the large particle signal (detection signal) 309. The black dot 316 (•) can be specified based on the coordinate and the signal intensity the same as the black dot 314 (•) in FIG. 3C. There is no distinction between the small particle signal and the noise signal for the black square dot 317 (■).

The inspection result of the two-stage threshold values may be provided with a flag for determining which threshold value is used for the inspection. At least the following information is recorded in the inspection result, which includes 1: defect ID, 2: signal intensity (or size), 3: coordinate (plane coordinate system or polar coordinate system), 4: inspection threshold value flag (for example, common threshold value of Th1 being 0 and Th2 being 1), 5: wafer information (wafer identification ID and process state). However, the items 1 to 4 are given by the number of the detected defects (signals exceeding Th1), and the item 5 is given for each inspection result. The inspection result to which information is added is stored in the recording device 112. Whether the inspection result is for the pre-formation inspection or the post-formation inspection is determined by referring to the process state.

(iv) Post-Formation Inspection Content (iv-1) Step 2031

The observation signal processing system 107 sets a reference of a result of the two-stage threshold values when the post-formation inspection is started. Since there is also an inspection method in which the result of the two-stage threshold values is not used in the post-formation inspection, the result of the two-stage threshold values is confirmed in the step. For example, the observation signal processing system 107 checks each piece of information of inspection results of the above two-stage threshold values, and confirms whether there is a pre-formation inspection corresponding to the post-formation inspection, and whether this is a result obtained by taking the two-stage threshold values.

(iv-2) Step 2032

Similar as in step 2012, the observation signal processing system 107 acquires the signal of the scattered light obtained by irradiating the wafer 101 with the illumination light.

(iv-3) Step 2033

The observation signal processing system 107 acquires a result obtained in step 2032 as a result 2. In this inspection step, the common threshold value (Th1) is used.

(iv-4) Step 2034

The observation signal processing system 107 checks the result 1A of FIG. 2B against the result 2 using the calculation device 113 of FIG. 1A. The observation signal processing system 107 corrects the coordinate of the result 2 so as to approach the coordinate of the result 1A using the calculation device 114 of FIG. 1A. This is a so-called fine alignment using an actual defect. The result 2 after the alignment is set as a result 2'.

(iv-5) Step 2035

The observation signal processing system 107 checks the result 2' against the result 1A+1B using the calculation device 113 of FIG. 1A. Among results 2', the defect matching the coordinate of the result 1A+1B is a defect generated before the film formation process.

Therefore, among the results 2', a defect that does not match the coordinate of the result 1A+1B is a defect generated in the film formation process.

(v) Supplementary Description for Post-Formation Inspection

Figure 4A:
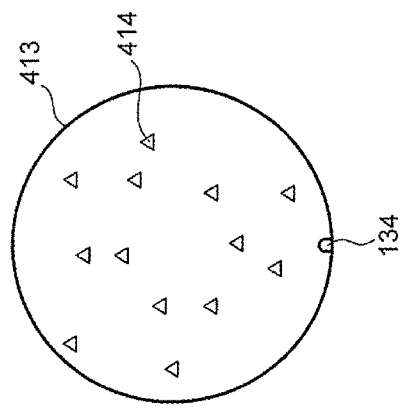
FIGS. 4A to 4D are diagrams showing a detection signal and a checking result in the post-formation inspection.
Figure 4B:
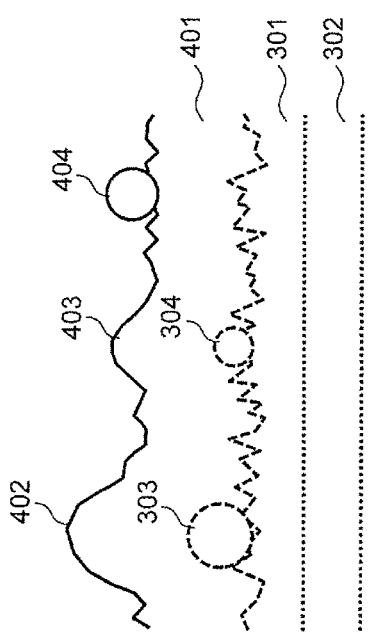
Figure 4C:
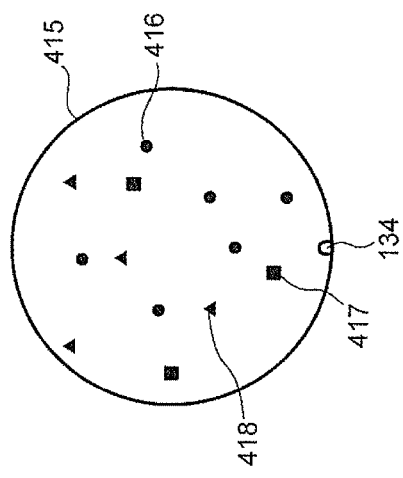
Figure 4D:
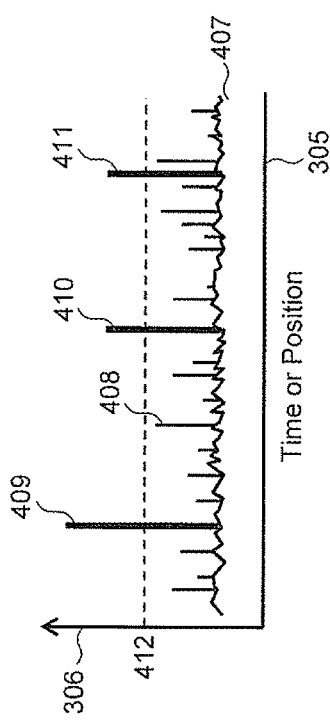

The post-formation inspection (FIG. 2C) will be supplementarily described with reference to FIG. 4. Similar as in FIG. 3, the particle is taken as an example. FIG. 4A is a diagram showing a cross section of a wafer surface to be subjected to the post-formation inspection. FIG. 4B is a diagram showing a detection signal (example) when FIG. 4A is inspected. FIG. 4C is a diagram showing an inspection result (example) detected by a threshold value Th_412 of the post-formation inspection. FIG. 4D is a diagram showing an inspection result (example) after a coordinate correction.

In FIG. 4A, a layer 401 represents a layer generated in the film formation process. On a surface of the layer 401, a film swelling 402 having the large particle 303 as a core, and a film swelling 403 having a small particle 304 as a core are generated. In addition, a particle 404 generated in the film formation process is an on-film particle.

As shown in FIG. 4B, similar as in FIG. 3B, a stationary signal 407 is output by the background light scattered from the wafer surface. In addition to this stationary output, a random noise signal 408 is generated. A signal by the film swelling 402 is referred to as a signal 409, and a signal by the film swelling 403 is referred to as a signal 410. In general, a size of the film swelling becomes larger than a particle serving as the core. Therefore, the signal 310 is equivalent to the noise signal 308 in FIG. 3B, but the signal 410 becomes larger than the noise signal 408. Similarly, the signal 409 is also sufficiently larger than noise signal 408. A signal of the on-film particle 404 is a signal 411.

Here, a threshold value of the post-formation inspection is set to the threshold value of the post-formation inspection Th_412 (a value different from Th1 and Th2) at which the noise signal is not detected. A result obtained in this manner is shown in FIG. 4C. Then, when FIG. 3C is checked against FIG. 4C, a defect having the same coordinate as the black dot 314 (•) is found. Using the black dot 314 (•) as a target, a coordinate of a white triangular dot (Δ) can be corrected. As a correction amount, a deviation in a plane direction, a deviation in a rotation direction, a deviation in enlargement or reduction in an R direction, and the like can be targeted.

Then, FIG. 4D after the correction is checked against FIG. 3D. In FIG. 3D, there are a large number of noise signals 317 (■). By the coordinate correction described above, a signal of a small particle such as the signal 310 is checked against the black square dot (■) (the positions of the signals match). A signal of a large particle such as the detection signal 309 is checked against the black circle dot 416 (•) (the positions of the signals match). Therefore, a signal 418 (▲) which is not checked against can be classified as an on-film defect.

The classification result is output as additional information to the inspection result. When the coordinate correction described above is used, a pre-formation inspection device and a post-formation inspection device do not necessarily have to be the same device. However, the inspection result with the two-stage threshold values including the noise signal is necessary for the result of the pre-formation inspection. In addition, if an inspection with the two-stage threshold values is performed at the time of the post-formation inspection, it can be utilized as the result of the pre-formation inspection in the next film formation process.

(vi) Difference from Existing Inspection

In an existing (related) inspection, information in FIG. 3D is not acquired. Even if the noise signal is acquired, the fine alignment using the actual defect is not performed, so that a coordinate accuracy between the pre-formation inspection and the post-formation inspection is low. Therefore, it is difficult to find a signal due to a minute defect included in the noise signal. Therefore, there is a possibility that the black square dots 417 (■) in FIG. 4D may be erroneously determined as the on-film defect. Therefore, in the existing inspection, in order to eliminate such erroneous determination, it is necessary to set an inspection threshold value at which the signal 408 with a core equivalent to the noise signal is not detected in the pre-formation inspection, that is, to reduce a sensitivity (see PTL 1).

However, in this case, the signal 411 of the on-film defect 404 cannot be detected, which makes it difficult to manage the film formation process.

Therefore, by using the method according to the first embodiment, it is possible to improve the sensitivity of the post-formation inspection and a determination accuracy of the on-film defect as compared with the related art.

(2) Second Embodiment

In a second embodiment, an inspection result obtained by the two-stage threshold values is used for detection signals of the detection systems.

In general, a signal obtained by weighting and adding signals of the detection systems can be inspected with highly sensitivity, and the noise signal can be reduced.

On the other hand, depending on a material and a shape of the defect, there is a strong directivity in a scattered light distribution and can be detected only in a specific detection system. For example, a signal such as a black circle dot 505 in FIG. 5 corresponds to the case. In the first embodiment, although the example using the result 1A and the result 1A+1B is shown for the addition signals, results of detection systems A, B, C . . . can be recorded independently, and all the results can be merged and used.

Accordingly, it is possible to improve the determination accuracy of the on-film defect by using the defect that can be detected only by the specific detection system described above.

(3) Third Embodiment

In the first embodiment described above, by performing the coordinate correction using the result of the pre-formation inspection with the two-stage threshold values, a post-formation inspection sensitivity and the on-film defect determination accuracy (or the distinction and the classification of the on-film defect and the film swelling) can be improved. On the other hand, in the third embodiment, a method of further improving a classification accuracy of a defect determined to be the on-film defect in the first embodiment, or a method of classifying the film swelling and the on-film defect only by the post-formation inspection when there is no result of the inspection with the two-stage threshold values will be described.

<Schematic Configuration of Inspection Device>

FIG. 6 is a diagram showing a schematic configuration of an inspection device 30 according to the third embodiment. In addition to the configuration of the inspection device 10 (see FIG. 1A) according to the first embodiment, the inspection device 20 further includes an input unit 601 configured to input film information and an inspection condition, an instruction database 602, and a comparison device (comparison unit) 603 configured to compare instruction data with a measurement signal.

Film information input to the input unit 601 (for example, input by the operator or read out and input in response to an instruction by the operator from a memory not shown) is film formation design information, and includes, for example, a film thickness, and a film type or a refractive index of a film to be formed. Here, examples of the film type (material) include, but are not limited to, an oxide film ($SiO_2$), silicon nitride (SiN), TiN, and Cu. The inspection condition includes at least one piece of information such as an incident angle of the illumination light, a polarization characteristic of light (P polarization, C polarization, or S polarization), information on a light receiver side (a light reception angle and a type of light that can be received (the P polarization, the C polarization, or the S polarization).

The instruction database 602 stores index data prepared in advance for determining whether a signal obtained as a result of the inspection is a signal by the film swelling or a signal by the on-film defect. In other words, instruction data is, for example, data on a signal intensity ratio when a defect that has already been determined to be the film swelling is measured under a predetermined condition. Therefore, the signal intensity ratio changes if the film thickness is different even for the same defect size.

<Classification Processing of On-film Defect and Film Swelling>

Figure 7A:
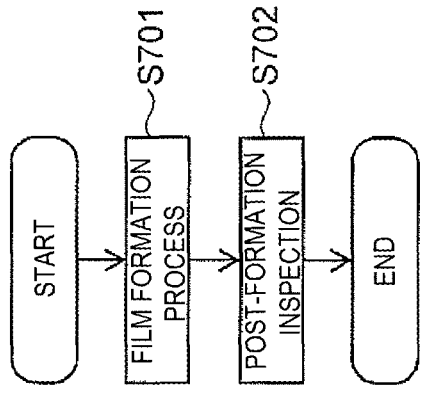
FIGS. 7A and 7B are flowcharts showing a classification process of an on-film defect and a film swelling based on information on a refractive index and thickness of a film formed on a wafer obtained in the post-formation inspection according to the third embodiment.
Figure 7B:
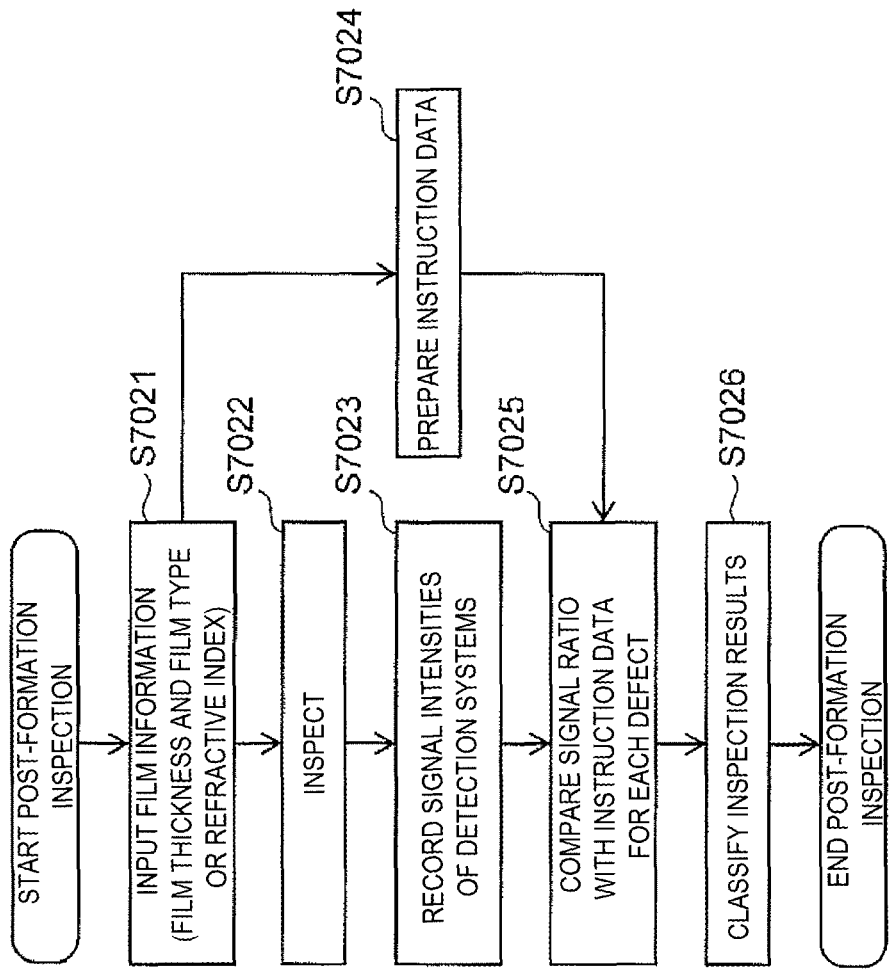

FIG. 7 is a flowchart showing a classification process of an on-film defect and a film swelling based on information on a refractive index and thickness of a film formed on a wafer obtained in the post-formation inspection according to the third embodiment. FIG. 7A is a diagram showing an entire image of the inspection process of the film formation process. FIG. 7B is a flowchart showing details of the post-formation inspection (step 702) according to the third embodiment.

(i) Entire Image of Inspection Process of Film Formation Process (FIG. 7A)

First, a film formation process of forming a film on a wafer is performed (step 701). Next, a post-formation inspection is performed on the wafer after the film formation process by using the inspection device 20 (step 702).

(ii) Details of Post-Formation Inspection (Step 702)

(ii-1) Step 7021

When the post-formation inspection is started, the input unit 601 receives, for example, film information input by the operator. Here, film information is, for example, information on the film thickness, the film type, or the refractive index.

When an inspection target has a multilayer structure, film information is input with respect to a layer within a range affected by a wavelength of the inspection device 20.

(ii-2) Step 7022

The observation signal processing system 107 acquires a signal of the scattered light (a signal detected by the detection systems 181 to 186) obtained by irradiating the wafer 101 with the illumination light.

(ii-3) Step 7023

The observation signal processing system 107 records signal intensities of the detection signals of the detection systems 181 to 184 in the recording device 112.

(ii-4) Step 7024

In parallel with the processing of step 7023, the observation signal processing system 107 prepares instruction data based on the input film information. Here, preparation means reading instruction data corresponding to the input film information (that is, conforming to the film thickness and the film type (refractive index)) from the instruction data database 602.

(iii-5) Step 7025

The observation signal processing system 107 uses the detection signals of the detection systems acquired in step 7023 to calculate a signal intensity ratio of a predetermined detection system pair. Then, the observation signal processing system 107 compares the calculated signal intensity ratio with instruction data read in step 7024 with respect to the detected defect. The comparison is performed, for example, by calculating the distance to the instruction data or a size relationship with the instruction data.

(iv-6) Step 7026

By applying a determination threshold value to the result of step 7025, the observation signal processing system 107 classifies the detected defects into the film swelling or the on-film defect.

(iii) Supplementary Description for Post-Formation Inspection

Figure 8:
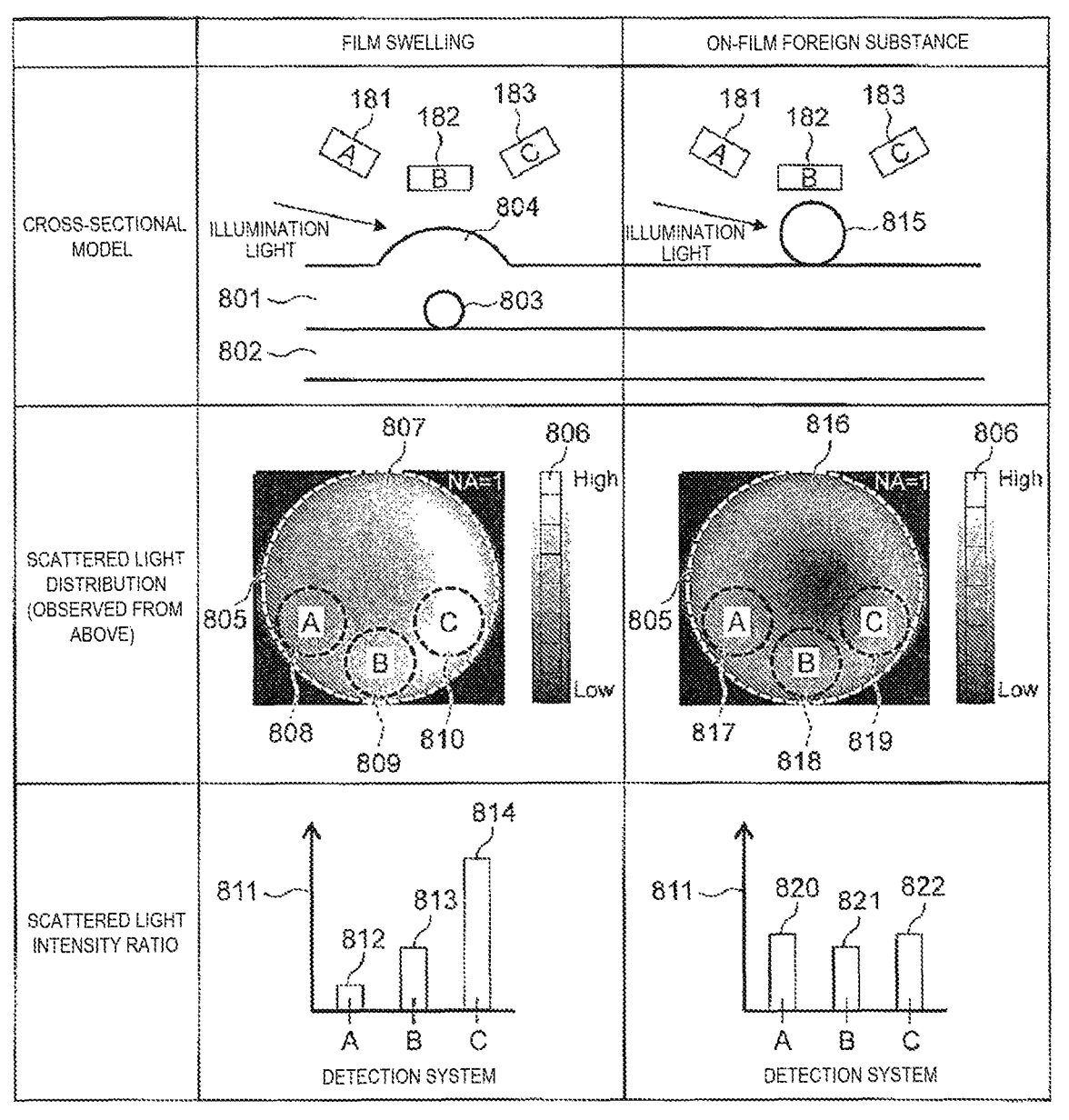

The post-formation inspection according to the third embodiment will be supplementarily described with reference to FIGS. 8 to 10. Among the defects, a particle is taken as an example. FIG. 8 is a diagram showing a scattered light distribution and a detection signal ratio for the film swelling and for the on-film defect. FIG. 9 is a diagram showing a relationship between a core defect and a film swelling. FIG. 10 is a diagram showing classification of the film swelling and the on-film defect based on the detection signal ratio.

A cross-sectional model of the film swelling shown in FIG. 8 includes a layer 801 generated in the film formation process, a layer 802 formed in a previous process before the film formation of the layer 801, a particle 803 before the film formation, and a film swelling 804 in which the particle 803 is a core. The scattered light distribution when the illumination light is emitted to the film swelling 804 is acquired by the detection systems A, B, and C. Here, a reason why only the detection systems A to C are used is that the detection systems D to F are symmetrical with the detection systems A to C in a vertical direction (up and down on a paper surface), so that instruction data can be similarly expressed. A column of the scattered light distribution in FIG. 8 shows a scattered light distribution 807 observed from above, a region 805 with NA=1, and a scattered light amount 806. In the cross-sectional model, a scattered light amount on a front side is larger than an illumination light from a left side of the paper surface (see a column of the cross-sectional model in FIG. 8). In a graph shown in a column of a scattered light intensity ratio, when the vertical axis indicates a signal intensity 811, the signal intensities of the detection systems are a signal intensity 812, a signal intensity 813, and a signal intensity 814, respectively.

An on-film particle 815 is also similar to the on-film swelling 804. In this case, the scattered light distribution has the same scattered light amount at a front side, a lateral side, and a rear side, and the signal intensities of the detection systems are a signal intensity 820, a signal intensity 821, and a signal intensity 822.

Next, with reference to FIG. 9, the relationship between the core particle and the film swelling will be described. When the particle 803 having a diameter 901 of D is on the layer 802, and a film thickness 902 of the layer 801 is T, the film swelling 804 grows into a sphere having a radius 903 of (T+D/2) from a center of the particle 803. Here, a height 904 of the film swelling 804 is D, and a diameter 905 of the film swelling 804 as viewed from above is $2\sqrt{}/(2\times T\times D)$. That is, it can be said that the relationship between the core particle and the film swelling is that the larger the core particle, the larger the film swelling 804 and the larger the scattered light amount.

Next, a result of simulating the signal intensities of the detection systems A and C by changing a size of the particle will be described with reference to FIG. 10. In FIG. 10, a straight line 1001 is a line connecting plots relating to the film swelling (■: the signal intensity ratio of the predetermined detection system pair), and a numerical value on a graph represents the diameter of the core particle. A straight line 1002 is plots relating to an on-film particle (•: the signal intensity ratio of the predetermined detection system pair), and a numerical value represents the diameter of the particle. The straight line 1001 and the straight line 1002 correspond to instruction data. Even if the size of the particle changes, the straight line 1001 and the straight line 1002 are separated from each other and do not intersect each other. When a center line 1003 is set as a threshold value, if a measured signal intensity ratio is on a region 1004 side, it can be classified as the film swelling, and on the contrary, if a signal intensity ratio is on a region 1005 side, it can be classified as an on-film particle. The obtained classification result is output as additional information to the inspection result.

In FIG. 10, as the straight line 1001 and the straight line 1002 are farther apart, the classification is easy and the classification accuracy is improved. In FIG. 10, instruction data is obtained by taking the pair of detection system A and detection system C as an example, but it is also possible to perform classification under a condition that a distance between the straight line 1001 and the straight line 1002 is as large as possible by combining other detection systems, comparing three detection systems, or comparing N detection systems. The straight line 1001 and the straight line 1002 depend on film information (the film thickness and the refractive index) and the inspection condition. Therefore, it is necessary to obtain the center line 1003 from information on the film thickness and the refractive index. In order to perform the classification, in addition to the method of obtaining the center line 1003, the distance between the straight line 1001 and the straight line 1002 may be calculated from a plot of the detection signal intensity, and classified as a shape having a smaller distance. It is also possible to present, to a user, the film thickness that optimizes the classification accuracy in the film formation process by using the fact that the distance between the straight line 1001 and the straight line 1002 is changed when the film thickness is changed. This information can be output together with the inspection result.

When the defects are classified using such instruction data, for example, the black dot 416+black square dot 417 and the black triangular dot 418 in FIG. 4D can be classified. In addition, it is also possible to classify the on-film defect and the film swelling included in the black triangle dots 418 without the pre-formation inspection information, and the classification accuracy can be further improved.

(4) Fourth Embodiment

In the third embodiment, the method of classifying the film swelling and the on-film defect using instruction data acquired (simulated) based on the input film information is described as an example, whereas in the fourth embodiment, an alternative method (modification) will be described with respect to a method of inputting film information and a method of preparing instruction data. FIG. 11 is a diagram showing a method of acquiring film information and a method of preparing instruction data.

(i) Method of Inputting Film Information

Examples of a film thickness input method (corresponding to step 7021) include the following three methods.

(i-1) Method of Input by Operator (User) (Step 1101)

This is a method in which the operator (user) directly inputs information of the film thickness and the refractive index. An input value can be, for example, a value measured by an ellipsometer other than the inspection device 20.

(i-2) Recipe Selection (Step 1102)

This is because the information on the film thickness and the refractive index is previously tabulated for the process, so that the operator (user) can input the film thickness and the refractive index only by selecting the process.

(i-3) Measurement of Film Thickness and Refractive Index (Step 1103)

As shown in FIG. 12, for example, an ellipsometer 1201 is attached to a mini environment in the inspection device 20, and measures the film thickness and the refractive index when the wafer 101 is transferred. In this manner, the film information of the wafer 101 can be automatically input.

(ii) Method of Preparing Instruction Data

Examples of the method of preparing instruction data (corresponding to step 7023) include the following two methods.

(ii-1) Simulation Method (Step 1104)

Instruction data can be generated by performing a simulation based on the obtained film thickness and the refractive index. As a simulation method, for example, the on-film defect can be calculated by a Bobbert & Vliger (BV) method, a discrete dipole approximation (DDA) method and a finite difference time domain (FDTD) method, and the film swelling can be calculated by the DDA method and the FDTD method. In addition to performing these calculations in real time, there is a method of previously creating a database that has been calculated in advance.

(ii-2) Method According to Experiment (Step 1105)

Instruction data can be generated by referring to experimental values. This is a method in which inspection is performed, by the inspection device 20 including the detection systems A to F, on the wafer 101 whose film information is known in advance with respect to a film swelling and an on-film defect observed with a multi-purpose scanning electron microscope (DR-SEM) or an atomic force microscope (AFM), for example, and signal intensities of the detection systems are stored into a database.

(5) Fifth Embodiment

In the third embodiment described above, the example in which the inspection is performed with a threshold value larger than the noise signal at the time of the post-formation inspection has been described, whereas in a fifth embodiment, a method of inspecting with a threshold value including the noise will be described. As shown in FIG. 5 described above, when inspection threshold values of the detection systems A to F are lowered, results of the detection systems A to F include a defect signal of the same level as the noise signal. Therefore, for example, with the result of the addition signal as a target, the fine alignment using the actual defect is performed based on the results of the detection systems A to F. By checking against this correction result, a detection signal of a minute film swelling in the noise signal can be acquired. That is, since smaller film swellings can be classified, it is possible to further improve the sensitivity of the post-formation inspection and the determination accuracy of the on-film defect.

(6) Sixth Embodiment

In the first embodiment described above, the inspection method in which the two-stage threshold values are set has been described, whereas in a sixth embodiment, the pre-formation inspection in which the two-stage threshold values are not set will be described.

FIG. 13 is a diagram showing the pre-formation inspection in which the two-stage threshold values are not set. A configuration of FIG. 13 is the same in appearance as the configuration of FIG. 1, but the signal processing system (classification signal processing system 1_110) using a high threshold value is not operating. Even if such a configuration is used, it is possible to classify defects into the film swelling and the on-film defect. For example, in the pre-formation inspection, an inspection is performed with a low threshold value for all the signals including the noise signal. At this time, only the result 1A+1B of FIG. 2 can be acquired. In step 2034 of FIG. 2C, the coordinate of the result 2 is corrected by using a defect having a signal intensity of a certain level or more among results 1A+1B instead of the result 1A. A subsequent procedure is the same as the processing according to the first embodiment.

(7) Seventh Embodiment

In the first embodiment described above, the method of classifying the defects into the film swelling and the on-film defect by checking the result of the post-formation inspection against the result of the pre-formation inspection by the inspection device 10 alone has been described, whereas in a seventh embodiment, a method of using a server installed outside the inspection device 10 will be described. A plurality of examples will be described below.

(i) System Including Inspection Device 10 and Server

FIG. 14 is a diagram showing a connection relationship between a plurality of inspection devices (inspection device 10) and a server. Although FIG. 14 shows a configuration of the inspection device 10 according to the first embodiment as an inspection device, the inspection device may include the configuration of the inspection device 20 according to the third embodiment.

(i-1) System Configuration with Only One Server

Figure 14B:
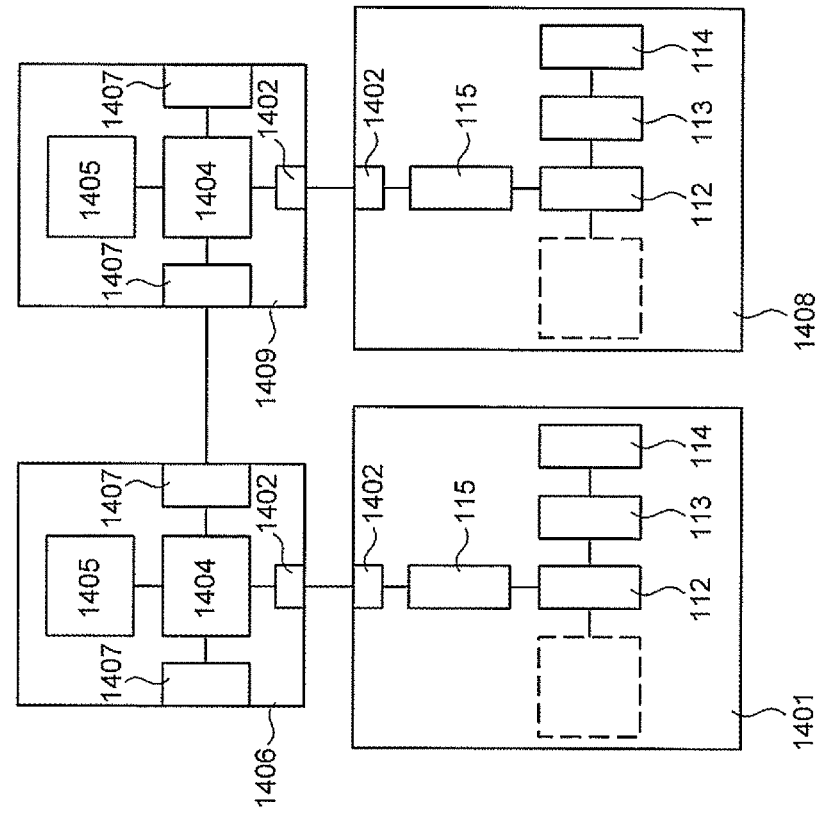
FIGS. 14A and 14B are diagrams showing a connection relationship between a plurality of inspection devices and servers.
Figure 14A:
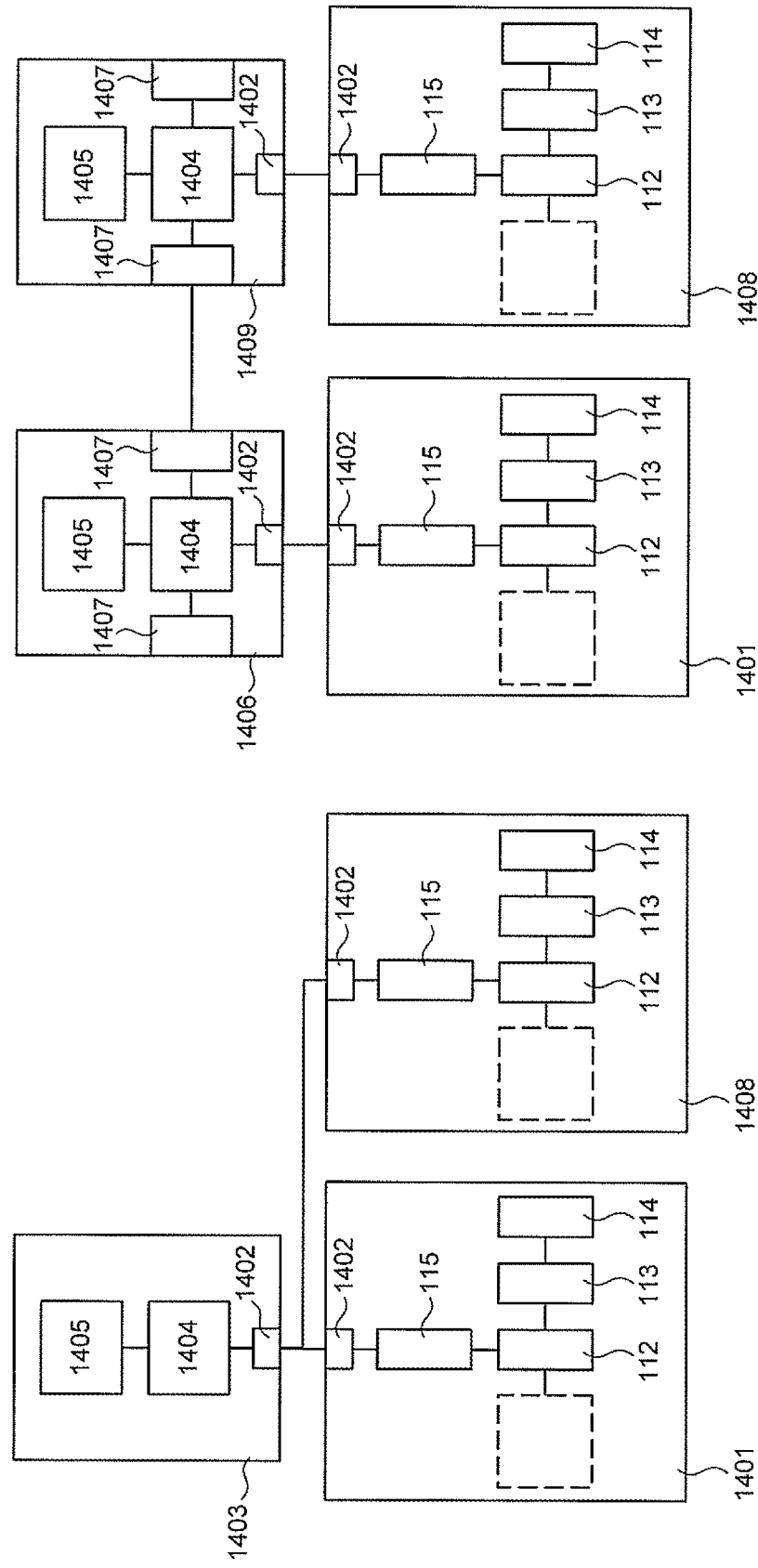

FIG. 14A is a diagram showing a system configuration example in which a plurality of inspection devices 1401 and 1408 are connected to one server 1403. The inspection devices 1401 and 1408 have the same configuration as the inspection device 10 of FIG. 1A and are connected to server 1403 via an I/F 1402. The server 1403 includes at least constituent elements of a calculation device 1404 and a recording device 1405. Connections between the server 1403 and the inspection devices 1401 and 1408 may be relayed by using a hub other than the IF 1402.

When the pre-formation inspection is performed by the inspection device 1401, the inspection result is recorded in the recording device 112 of each inspection device, is transferred to the server 1403, and is also recorded in the recording device 1405. When the post-formation inspection of the wafer 101 is performed by the inspection device 1408 different from the inspection device 1401, the result of the pre-formation inspection is transferred from the recording device 1405 to the inspection device 1408 (may be transferred from the recording device 112 of the inspection device 1401 to the inspection device 1408), and the classification processing is performed by the calculation device 113 and the calculation device 114 in the inspection device 1408. The classification result is again transferred to the server 1403 and recorded in the recording device 1405.

(i-2) System Configuration with a Plurality of Servers

FIG. 14B is a diagram showing an example of a system configuration in which servers 1406 and 1409 connected to the inspection devices 1401 and 1408 are connected. The inspection devices 1401 and 1408 are not connected to each other.

When the pre-formation inspection is performed by the inspection device 1401, the result is stored in the recording device 1405 of the server 1406. When the post-formation inspection of the wafer is performed by the inspection device 1408, the result of the pre-formation inspection is transferred from the server 1406 to the server 1409, and the classification processing can be performed by the calculation device 113 and the calculation device 114 in the inspection device 1408.

(ii) System Including Part of Configuration of Inspection Device 10 and Server FIG. 15 is a diagram showing a system configuration example including a server and inspection devices from which the calculation device 113 that checks the inspection result against the coordinate and the calculation device 114 that performs the actual defect alignment using the checking result are removed from the inspection device 10.

(ii-1) System Configuration with Server Provided Externally

Figure 15B:
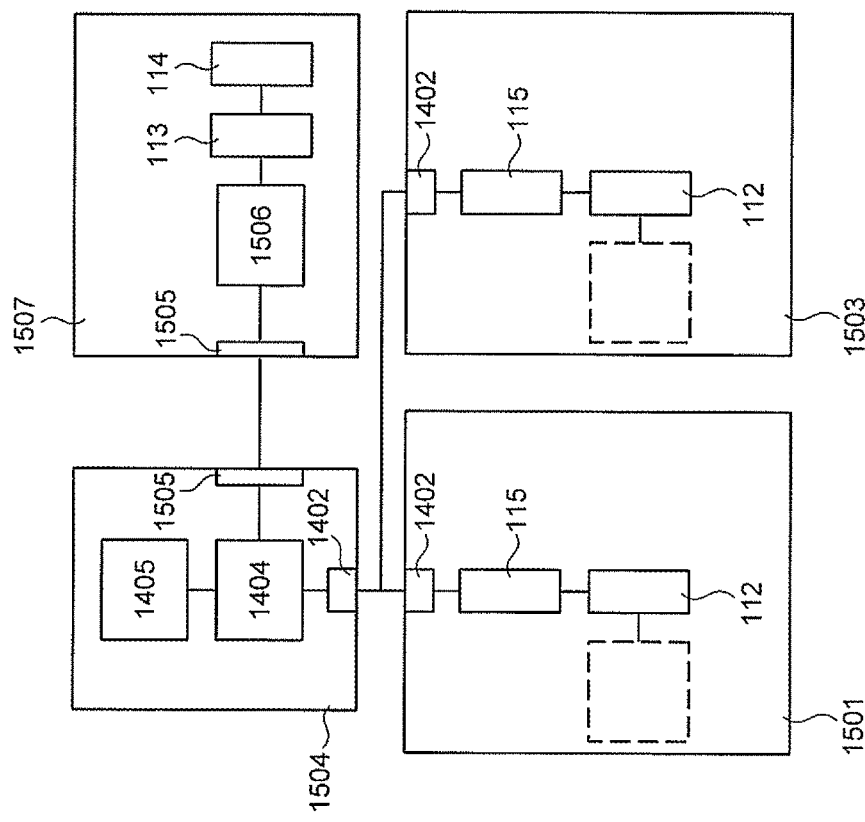
FIGS. 15A and 15B are diagrams showing a system configuration example including a server and inspection devices from which a calculation device 113 that checks inspection results against a coordinate and a calculation device 114 that performs an actual defect alignment using the checking result are removed from the inspection device 10.
Figure 15A:
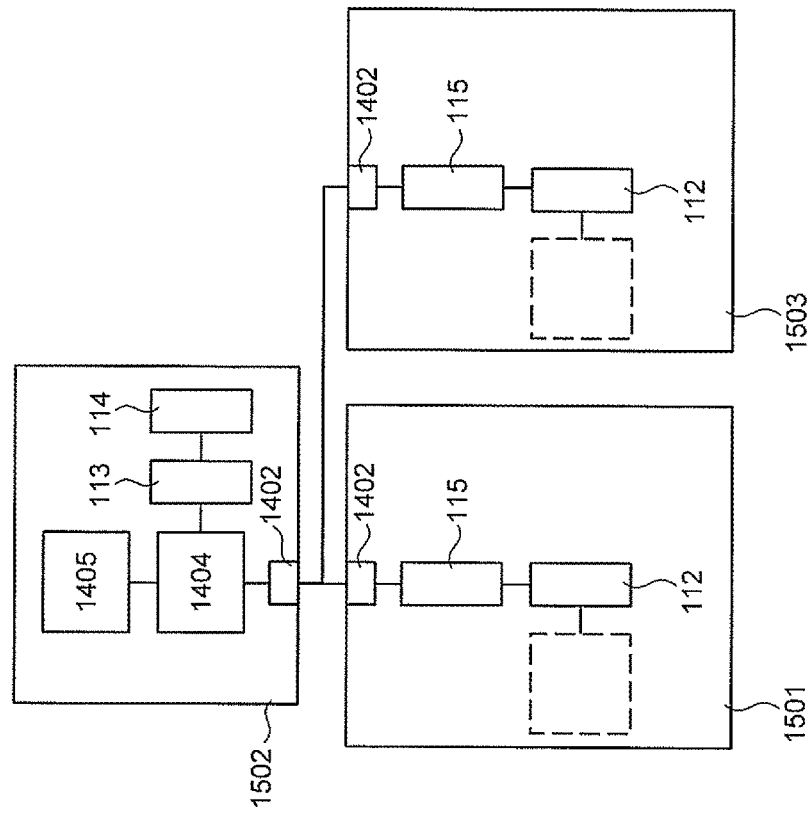

FIG. 15A is a configuration example in which a server 1502 includes the calculation device 113 and the calculation device 114 provided in the inspection device 10.

According to the system, when the pre-formation inspection is performed by an inspection device 1501 and the post-formation inspection of the same wafer is performed by an inspection device 1503, two inspection results are stored in the recording device 1405 of the server 1502. The classification processing is performed by the calculation device 113 and the calculation device 114 in the server 1502, and the classification result is again stored in the recording device 1405.

(ii-2) System Configuration with Server and Classification Device Provided Externally FIG. 15B is a diagram showing a system configuration example in which a classification device 1507 is provided in addition to the inspection devices 1501 and 1503 and a server 1504, and the classification device 1507 is connected to the server 1504.

When the pre-formation inspection is performed by the inspection device 1501 and the post-formation inspection of the same wafer is performed by the inspection device 1503, the two inspection results are stored in the recording device 1405 of the server 1504. These two inspection results are transferred to a recording device 1506 of the classification device 1507 via an I/F 1505, and the classification processing is performed by the calculation device 113 and the calculation device 114 in the classification device 1507. The classification result is again stored in the recording device 1405 of the server 1504.

(8) Eighth Embodiment

In the third embodiment described above, a method of classifying the detection signal intensity ratio by the inspection device 20 alone has been described, whereas in an eighth embodiment, a system configuration in which devices 1602 to 1604 having a defect classification calculation function are provided outside the inspection device 20 will be described.

(i) Configuration with Server Having Defect Classification Calculation Function

Figure 16B:
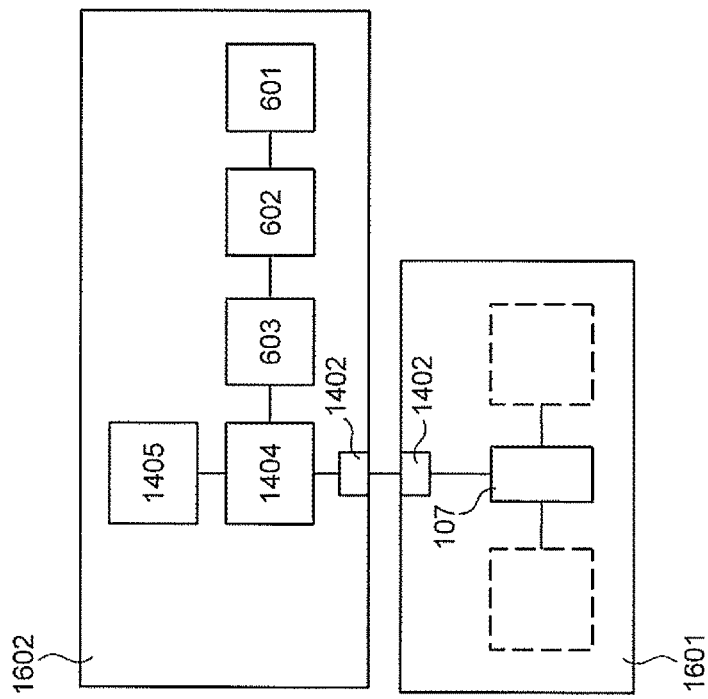
FIGS. 16A and 16B are diagrams showing a system configuration example in which a server 1602 has a defect classification calculation function and a system configuration example in which a classification device is provided in addition to the server.
Figure 16A:
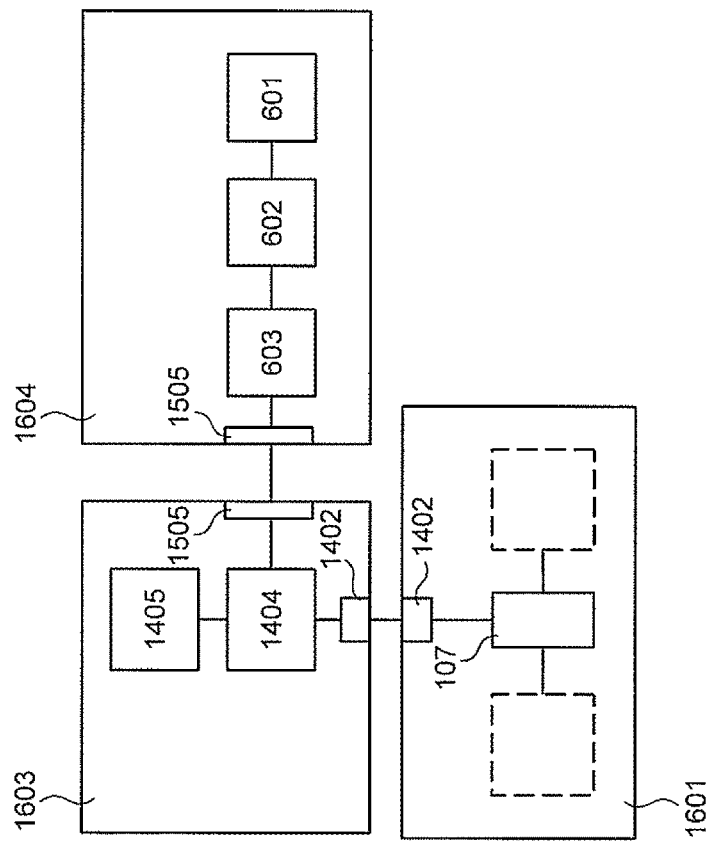

FIG. 16A is a diagram showing a configuration example in which a server 1602 has a defect classification calculation function. Signals of detectors acquired by an inspection device 1601 are stored in the recording device 1405 of the server 1602 via the I/F 1402. The film information and the inspection condition of the inspection process are input to the input device 601 by the operator, the instruction data is read out from the instruction database 602, and the instruction data is prepared, and the classification processing is performed by the comparison device 603. The classification result is stored in the recording device 1405.

(ii) Configuration with Independent Device with Defect Classification Calculation Function FIG. 16B is a diagram showing a system configuration example in which a classification device 1604 is provided in addition to the inspection device 1601 and the server 1603, and the classification device 1604 is connected to the server 1603. Signals of detectors acquired by an inspection device 1601 are stored in the recording device 1405 of the server 1602 via the I/F 1402. The result is transferred to the classification device 1604 along with the film information and the inspection condition of the inspection process, and the classification processing is performed by the comparison device 603. Then, the classification result is transferred to the server 1603 again, and is stored in the recording device 1405.

(9) Other Embodiments and the Like (i) In the defect classification devices according to the embodiments, a signal intensity of a first detection signal (a signal from the pre-formation inspection) obtained by irradiating a wafer before the film formation process with a light is compared with a first threshold value and a second threshold value (smaller than the first threshold value), and an inspection signal of the first threshold value or more is taken as a first result (result LA) and an inspection signal of the second threshold value or more and less than the first threshold value is taken as a second result (result 1B). Then, a second detection signal (a signal from a post-formation inspection) obtained by irradiating the wafer after the film formation process with a light is acquired, and a defect on the wafer is classified by comparing the first result and the second result with the second detection signal. With the classification processing, it is possible to specify the on-film particle deposited on the film generated on the wafer due to the film formation process. In this way, the defect on the wafer surface can be clearly distinguished between the on-film defect and the film swelling, and the defect can be efficiently classified. In addition, improvement in the sensitivity of the post-formation inspection can be expected.

In the present embodiment, the defect classification device according to the embodiment acquires a plurality of first detection signals (signals from the pre-formation inspection) detected by a plurality of detection systems, adds the plurality of first detection signals to generate a first addition signal, acquires a plurality of second detection signals (signals from the post-formation inspection) detected by a plurality of detection systems, and adds the plurality of second detection signals to generate a second addition signal. Then, the defect classification device classifies the defect on the wafer by comparing the first threshold value with a signal intensity of the first addition signal, and the second threshold value with the signal intensity of the first addition signal to acquire a first result and a second result, and comparing the first result and the second result with the second addition signal. By using information of the scattered light distribution obtained by the plurality of detection systems (multi-detector) as described above, the classification can be performed on the entire wafer without impairing a superiority of a high-speed inspection.

Further, in the present embodiment, a coordinate corresponding to a second detection signal is corrected using the first result (result LA), and the second detection signal after the coordinate correction is compared with the first result and the second result (result 1B). In this way, since a positional deviation of the defect is corrected, the on-film defect can be accurately specified and classified.

(ii) In the defect classification devices according to the embodiments, the defect on the wafer can be classified using the instruction data corresponding to the film information of the wafer. In this case, for example, the instruction data is read out from a storage device to determine whether a signal obtained from a result of the inspection is a signal due to the defect, the instruction data is compared with the signal intensity ratio of the detection signals (signals from the post-formation inspection) from at least two detection systems, and the defect on the wafer is classified based on a result of the comparison. For example, the instruction data is different for each film thickness, and is data based on first signal intensity ratio data when the defect is a film swelling and second signal intensity ratio data when the defect is an on-film defect in the signal intensity ratio of at least two detection systems. At this time, the defect classification device classifies the defect on the wafer according to distances between the signal intensity ratio of the detection signals (signals from the post-formation inspection) and the first signal intensity ratio data and the second signal intensity ratio data. The film information includes information on the film thickness and the refractive index of the film, and the film information is input by the user or obtained by actually measuring the wafer on which the film is formed before the post-formation inspection. The instruction data is acquired by executing a simulation based on information on the film thickness and the refractive index, or by calculating the signal intensity ratio of the detection signals obtained by observing the film swelling and the on-film particle on the wafer of which the film information is known in advance. In this way, simply by setting a threshold value for the post-formation inspection, the defect on the wafer surface can be clearly distinguished between the on-film defect and the film swelling, and the defect can be efficiently classified.

(iii) A function of the embodiments can be implemented by a program cord of software. In this case, a storage medium configured to record a program code is provided to the system or the device, and a computer (or CPU or MPU) of the system or the device reads the program code stored in the storage medium. In this case, the program code itself read from the storage medium implements functions of the above embodiments, and the program code itself and the storage medium storing the program code constitute an embodiment of the present disclosure. As the storage medium to supply such a program cord, for example, a flexible disk, a CD-ROM, a DVD-ROM, a hard disk, an optical disk, a magneto-optical disk, a CD-R, a magnetic tape, a nonvolatile memory card, or a ROM may be used.

An operating system (OS) or the like running on the computer may perform a part or all of an actual processing based on an instruction of the program cord, and the functions of the above embodiments may be implemented by the processing. After the program code readout from the storage medium is written in a memory of the computer, the CPU or the like of the computer may perform a part or all of the actual processing based on the instruction of the program code, and the functions of the above embodiments may be implemented by the processing.

Further, by distributing the program cord of software for implementation of the functions of the embodiment via a network, the program cord may be stored in a storage device such as a hard disk or a memory of the system or the device or in a storage medium such as a CD-RW or a CD-R, and may be executed by reading the program cord stored in the storage device or the storage medium by the computer (or the CPU or the MPU) of the system or the device during usage.

Finally, it is necessary to understand that processes and techniques described herein are not inherently relevant to any particular device and that any suitable combination of components may be implemented. Further, various types of devices for general purpose may be used in accordance with teachings described herein. It may be appreciated that it is beneficial to construct a specialized device to execute the steps of the method described herein. In addition, various inventions can be formed by appropriately combining a plurality of the constituent elements disclosed in the embodiments. For example, some constituent elements may be deleted from all the constituent elements disclosed in the embodiments. Further, the constituent elements in different embodiments may be appropriately combined. As described above, the present disclosure has been described with reference to specific examples, which are for illustrative purposes only and not for purposes of limitation. Those skilled in the art will recognize that there are numerous combinations of hardware, software, and firmware that are suitable for practicing the present disclosure. For example, described software may be implemented in a wide range of programs or scripting languages such as an assembler, C/C++, perl, Shell, PHP, and Java (registered trademark).

Further, in the above embodiments, a control line and an information line are considered to be necessary for description, and all control lines and information lines are not necessarily shown in a product. All of the configurations may be connected to each other.

In addition, other implementations of the present disclosure will become apparent to those of ordinary skill in the art from consideration of the description and embodiments. The various aspects and/or components of the described embodiments may be used alone or in any combination in a computerized storage system having a function to manage data. It is intended that the description and the specific examples be considered as exemplary only, with a scope and a spirit of the disclosure being indicated by the following claims.

REFERENCE SIGN LIST 10, 20, 30: inspection device
101: wafer
102: chuck
103: rotary stage
104: straight movement stage
105: light source
106: illumination optical system
107: observation signal processing system
108: control unit
109: operation system
110: classification signal processing system 1
111: classification signal processing system 2
112: recording device
113: calculation device
114: calculation device
115, 601: input unit
181: detection system A
182: detection system B
183: detection system C
184: detection system D
185: detection system E
186: detection system F

The invention claimed is:

1. A defect classification device comprising:
a storage device; and
a signal processing device configured to acquire a first detection signal obtained by irradiating a wafer before a film formation process with a light and a second detection signal obtained by irradiating the wafer after the film formation process with a light, classify a defect on the wafer using signal intensities of the first and second detection signals, and store a classification result in the storage device, wherein
the signal processing device is configured to
compare a first threshold value with a signal intensity of the first detection signal, and compare a second threshold value having a value smaller than the first threshold value with the signal intensity of the first detection signal, an inspection signal of the first threshold value or more being taken as a first result, and an inspection signal of the second threshold value or more and less than the first threshold value being taken as a second result; and
classify the defect on the wafer by comparing the first result with the second detection signal, and the second result with the second detection signal.

2. The defect classification device according to claim 1, wherein
the signal processing device specifies a defect deposited on a film generated on the wafer due to the film formation process.

3. The defect classification device according to claim 1, wherein
the signal processing device classifies the defect into a film swelling in which a defect below a film generated on the wafer due to the film formation process is taken as a core, and an on-film defect above the film.

4. The defect classification device according to claim 1, wherein
the signal processing device corrects a coordinate corresponding to the second detection signal using the first result, and compares the second detection signal after the coordinate correction with the first result and the second result.

5. The defect classification device according to claim 1, wherein
the signal processing device acquires a plurality of first detection signals detected by a plurality of detection systems, adds the plurality of first detection signals to generate a first addition signal, acquires a plurality of second detection signals detected by the plurality of detection systems, adds the plurality of second detection signals to generate a second addition signal, and classifies the defect on the wafer by comparing the first threshold value with a signal intensity of the first addition signal, and the second threshold value with the signal intensity of the first addition signal to acquire the first result and the second result, and comparing the first result with the second addition signal, and the second result with the second addition signal.

6. A defect classification device comprising:
a storage device; and
a signal processing device configured to acquire detection signals detected by a plurality of detection systems obtained by irradiating a wafer after a film formation process with a light, classify a defect on the wafer using signal intensities of the detection signals, and store a classification result in the storage device, wherein
the signal processing device is configured to read out, from the storage device, instruction data for determining whether a signal obtained from a result of an inspection is a signal due to a defect, the instruction data being corresponding to film information of the wafer, compare the instruction data with a signal intensity ratio of the detection signals from at least two detection systems, and classify the defect on the wafer based on a result of the comparing,
the instruction data is different for each film thickness included in the film information, and is data based on first signal intensity ratio data when the defect is a film swelling and based on second signal intensity ratio data when the defect is an on-film defect in the signal intensity ratio of at least two detection systems, and
the signal processing device classifies the defect on the wafer according to a distance between the signal intensity ratio of the detection signals and the first signal intensity ratio data, and a distance between the signal intensity ratio of the detection signals and the second signal intensity ratio data.

7. An inspection device, comprising:
an irradiation optical system configured to irradiate a wafer with an illumination light;
a plurality of detection systems configured to detect a scattered light from the wafer; and
the defect classification device according to claim 1.

8. An inspection device, comprising:
an irradiation optical system configured to irradiate a wafer with an illumination light;
a plurality of detection systems configured to detect a scattered light from the wafer; and
the defect classification device according to claim 6.

9. An inspection system comprising:
a plurality of inspection devices according to claim 7; and
at least one server configured to store an inspection result and a defect classification result from the inspection devices, wherein
a first inspection device executes an inspection before a film formation process on a wafer before the film formation process, acquires an inspection result before the film formation process, and transmits the inspection result before the film formation process to the server, the server receives the inspection result before the film formation process from the first inspection device, and transmits the inspection result before the film formation process to a second inspection device, and the second inspection device executes an inspection after the film formation process on the wafer after the film formation process, acquires an inspection result after the film formation process, classifies the defect using the inspection result before the film formation process and the inspection result before the film formation process, and transmits a defect classification result to the server.

10. An inspection system comprising:

a plurality of inspection devices including a first inspection device and a second inspection device; and at least one server configured to classify a defect by using inspection results from the inspection devices including the defect classification device according to claim 1, wherein the inspection devices each include an irradiation optical system configured to irradiate the wafer with an illumination light, and a plurality of detection systems configured to detect a scattered light from the wafer, the first inspection device executes an inspection before a film formation process on the wafer before the film formation process, and transmits an inspection result before the film formation process to the server, the second inspection device executes an inspection after the film formation process on the wafer after the film formation process, and transmits an inspection result after the film formation process to the server, and the server classifies the defect by using the inspection result before the film formation process and the inspection result after the film formation process received from the first inspection device and the second inspection device.

11. An inspection system comprising:

a plurality of inspection devices including a first inspection device and a second inspection device;

the defect classification device according to claim 1; and at least one server configured to store an inspection result from the inspection device and a defect classification result from the defect classification device, wherein the inspection devices each include an irradiation optical system configured to irradiate the wafer with an illumination light, and a plurality of detection systems configured to detect a scattered light from the wafer, the first inspection device executes an inspection before a film formation process on the wafer before the film formation process, and transmits an inspection result before the film formation process to the server, the second inspection device executes an inspection after the film formation process on the wafer after the film formation process, and transmits an inspection result after the film formation process to the server, the server transmits the inspection result before the film formation process and the inspection result after the film formation process received from the first inspection device and the second inspection device to the defect classification device, and the defect classification device classifies the defect by using the inspection result before the film formation process and the inspection result after the film formation process.

* * * * *